(12) United States Patent
Maejima

(10) Patent No.: US 11,244,726 B2
(45) Date of Patent: Feb. 8, 2022

(54) SEMICONDUCTOR STORAGE DEVICE

(71) Applicant: KIOXIA CORPORATION, Tokyo (JP)

(72) Inventor: Hiroshi Maejima, Setagaya Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/152,355

(22) Filed: Jan. 19, 2021

(65) Prior Publication Data

US 2021/0142853 A1 May 13, 2021

Related U.S. Application Data

(60) Continuation of application No. 16/842,633, filed on Apr. 7, 2020, now Pat. No. 10,902,918, which is a
(Continued)

(30) Foreign Application Priority Data

Jun. 27, 2012 (JP) ................................. 2012-144628

(51) Int. Cl.
*G11C 11/34* (2006.01)
*G11C 16/04* (2006.01)
(Continued)

(52) U.S. Cl.
CPC .......... *G11C 16/0483* (2013.01); *G11C 5/063* (2013.01); *G11C 7/06* (2013.01);
(Continued)

(58) Field of Classification Search
CPC ..... G11C 16/0483; G11C 5/063; G11C 16/08; G11C 16/26; H01L 23/5226;
(Continued)

(56) References Cited

U.S. PATENT DOCUMENTS 5,933,380 A 8/1999 Tsuchida et al.
6,359,301 B1 3/2002 Kuroda
(Continued)

FOREIGN PATENT DOCUMENTS

JP 2010034109 A 2/2010
JP 2010219195 A 9/2010

OTHER PUBLICATIONS

Office Action dated Jun. 23, 2015 in corresponding Japanese Patent Application No. 2012-144628 with English Translation, 9 pages.
(Continued)

*Primary Examiner* — Viet Q Nguyen
(74) *Attorney, Agent, or Firm* — Kim & Stewart LLP

(57) ABSTRACT

A semiconductor storage device includes word lines extending in first and second directions, and separated from each other in a third direction, sense amplifier circuits that partially overlap the word lines in the third direction, memory strings intersecting the word lines and extending in the third direction, memory-side bit lines extending in the first direction, separated from each other in the second direction, and including first and second adjacent memory-side bit lines, circuit-side bit lines between the word lines and the sense amplifier circuits and partially overlapping the respective memory-side bit lines in the third direction, and contact plugs extending in the third direction and respectively connecting the memory-side bit lines and the circuit-side bit lines. The contact plugs include first and second contract plugs that are electrically connected to the first and second memory-side bit lines, respectively, and are not aligned along the first or second direction.

11 Claims, 23 Drawing Sheets

Related U.S. Application Data division of application No. 16/391,041, filed on Apr. 22, 2019, now Pat. No. 10,643,702, which is a continuation of application No. 16/022,568, filed on Jun. 28, 2018, now Pat. No. 10,276,241, which is a continuation of application No. 15/583,609, filed on May 1, 2017, now Pat. No. 10,014,054, which is a continuation of application No. 14/788,629, filed on Jun. 30, 2015, now Pat. No. 9,672,927, which is a continuation of application No. 13/784,735, filed on Mar. 4, 2013, now Pat. No. 9,111,592.

(51) Int. Cl.

| | | |
|---|---|---|
| *G11C 5/06* | (2006.01) | |
| *G11C 7/06* | (2006.01) | |
| *H01L 27/11565* | (2017.01) | |
| *H01L 27/11573* | (2017.01) | |
| *H01L 27/11582* | (2017.01) | |
| *G11C 16/26* | (2006.01) | |
| *G11C 16/08* | (2006.01) | |
| *H01L 23/522* | (2006.01) | |
| *H01L 23/528* | (2006.01) | |
| *H01L 27/1157* | (2017.01) | |

(52) U.S. Cl.
CPC ............. *G11C 16/08* (2013.01); *G11C 16/26* (2013.01); *H01L 23/528* (2013.01); *H01L 23/5226* (2013.01); *H01L 27/1157* (2013.01); *H01L 27/11565* (2013.01); *H01L 27/11573* (2013.01); *H01L 27/11582* (2013.01)

(58) Field of Classification Search
CPC ............. H01L 23/528; H01L 27/11565; H01L 27/1157; H01L 27/11573; H01L 27/11582
USPC ............................................. 365/185.05, 63
See application file for complete search history.

(56) References Cited

U.S. PATENT DOCUMENTS

| | | | |
|---|---|---|---|
| 7,233,070 B2 | 6/2007 | Yi et al. | |
| 7,272,042 B2 | 9/2007 | Nakai | |
| 7,388,790 B2 | 6/2008 | Maejima et al. | |
| 7,560,766 B2 | 7/2009 | Kajimoto et al. | |
| 7,742,331 B2 | 6/2010 | Watanabe | |
| 7,782,673 B2 | 8/2010 | Maejima et al. | |
| 7,852,676 B2 | 12/2010 | Maejima | |
| 7,888,731 B2 | 2/2011 | Kim | |
| 7,986,000 B2 | 7/2011 | Mizukami et al. | |
| 8,044,448 B2 | 10/2011 | Kamigaichi et al. | |
| 8,111,536 B2 | 2/2012 | Maejima | |
| 8,270,193 B2 | 9/2012 | Siau et al. | |
| 8,288,816 B2 | 10/2012 | Komori et al. | |
| 8,405,141 B2 | 3/2013 | Matsuda et al. | |
| 8,482,055 B2 | 7/2013 | Choi et al. | |
| 8,638,584 B2 | 1/2014 | Chevallier et al. | |
| 8,654,584 B2 | 2/2014 | Kim et al. | |
| 8,730,717 B2 | 5/2014 | Hanzawa et al. | |
| 8,755,211 B2 | 6/2014 | Ozawa | |
| 8,797,780 B2 | 8/2014 | Lee et al. | |
| 8,891,276 B2 | 11/2014 | Siau et al. | |
| 8,946,897 B2 | 2/2015 | Yi et al. | |
| 8,952,426 B2* | 2/2015 | Maejima | H01L 27/11573 257/214 |
| 9,007,834 B2 | 4/2015 | Rhie | |
| 9,076,865 B2 | 7/2015 | Lee et al. | |
| 9,082,492 B2 | 7/2015 | Kwak | |
| 9,111,592 B2* | 8/2015 | Maejima | G11C 7/06 |
| 9,117,495 B2 | 8/2015 | Siau et al. | |
| 9,263,144 B2* | 2/2016 | Ito | G11C 16/26 |
| 9,318,159 B2 | 4/2016 | Iwaki | |
| 9,390,796 B2 | 7/2016 | Siau et al. | |
| 9,691,480 B2 | 6/2017 | Siau et al. | |
| 9,704,570 B2 | 7/2017 | Abe et al. | |
| 9,704,584 B2* | 7/2017 | Maejima | G11C 8/10 |
| 9,711,226 B2* | 7/2017 | Maejima | H01L 27/11573 |
| 9,741,733 B2 | 8/2017 | Lim et al. | |
| 9,824,762 B2 | 11/2017 | Maejima | |
| 9,922,717 B1* | 3/2018 | Maejima | G11C 16/26 |
| 9,941,013 B2 | 4/2018 | Maejima | |
| 9,953,708 B2* | 4/2018 | Maejima | G11C 5/02 |
| 9,984,761 B2 | 5/2018 | Maejima et al. | |
| 10,008,269 B2 | 6/2018 | Maejima | |
| 10,014,054 B2 | 7/2018 | Maejima | |
| 10,037,813 B2 | 7/2018 | Maejima et al. | |
| 10,126,957 B2 | 11/2018 | Maejima | |
| 10,276,241 B2 | 4/2019 | Maejima | |
| 10,504,597 B2* | 12/2019 | Futatsuyama | G11C 7/1042 |
| 10,643,702 B2 | 5/2020 | Maejima | |
| 10,672,483 B2 | 6/2020 | Maejima | |
| 10,672,487 B2 | 6/2020 | Maejima et al. | |
| 10,797,073 B2* | 10/2020 | Maejima | G11C 16/24 |
| 10,892,020 B2* | 1/2021 | Hioka | G11C 16/30 |
| 2003/0168715 A1 | 9/2003 | Bae | |
| 2005/0142756 A1 | 6/2005 | Park et al. | |
| 2007/0076494 A1 | 4/2007 | Takeuchi et al. | |
| 2007/0097736 A1 | 5/2007 | Inokuchi et al. | |
| 2007/0158731 A1 | 7/2007 | Bae et al. | |
| 2007/0206399 A1 | 9/2007 | Makino et al. | |
| 2008/0084728 A1 | 4/2008 | Sakuma et al. | |
| 2009/0283737 A1 | 11/2009 | Kiyotoshi | |
| 2009/0296446 A1 | 12/2009 | Asao | |
| 2010/0012980 A1 | 1/2010 | Song et al. | |
| 2010/0038616 A1 | 2/2010 | Nagashima et al. | |
| 2010/0046273 A1 | 2/2010 | Azuma et al. | |
| 2010/0097858 A1 | 4/2010 | Tokiwa et al. | |
| 2010/0172177 A1 | 7/2010 | Lee et al. | |
| 2010/0258779 A1 | 10/2010 | Mikawa et al. | |
| 2010/0320526 A1 | 12/2010 | Kidoh et al. | |
| 2011/0049604 A1 | 3/2011 | Nishihara | |
| 2011/0193136 A1 | 8/2011 | Moritoki et al. | |
| 2011/0215394 A1 | 9/2011 | Komori et al. | |
| 2011/0220987 A1 | 9/2011 | Tanaka et al. | |
| 2011/0233505 A1 | 9/2011 | Nitta | |
| 2011/0242872 A1 | 10/2011 | Hanzawa | |
| 2011/0267867 A1 | 11/2011 | Sakuma et al. | |
| 2011/0297911 A1 | 12/2011 | Shima et al. | |
| 2012/0025386 A1 | 2/2012 | Murata | |
| 2012/0026818 A1 | 2/2012 | Chen et al. | |
| 2012/0032250 A1 | 2/2012 | Son et al. | |
| 2012/0033503 A1 | 2/2012 | Kim et al. | |
| 2012/0106253 A1* | 5/2012 | Scheuerlein | G11C 7/18 365/185.13 |
| 2012/0230141 A1 | 9/2012 | Mochida | |
| 2013/0044531 A1 | 2/2013 | Baek et al. | |
| 2013/0070506 A1 | 3/2013 | Kajigaya | |
| 2013/0235666 A1 | 9/2013 | Sakamoto et al. | |
| 2014/0043902 A1 | 2/2014 | Unno | |
| 2014/0254231 A1 | 9/2014 | Cernea et al. | |
| 2015/0357376 A1 | 12/2015 | Seo et al. | |
| 2016/0189770 A1 | 6/2016 | Abe et al. | |
| 2016/0267994 A1 | 9/2016 | Maeda | |
| 2017/0221813 A1 | 8/2017 | Kim | |
| 2018/0012937 A1 | 1/2018 | Park et al. | |
| 2020/0083229 A1* | 3/2020 | Kim | G11C 11/4087 |

OTHER PUBLICATIONS

Office Action dated Jul. 17, 2015 in corresponding Taiwanese Patent Application No. 102122785 with English Translation, 7 pages.

Office Action dated Oct. 20, 2017 in corresponding Taiwanese Patent Application No. 106103749 with English Translation, 4 pages.

* cited by examiner

SEMICONDUCTOR STORAGE DEVICE

CROSS-REFERENCE TO RELATED APPLICATION

This application is a continuation of U.S. patent application Ser. No. 16/842,633, filed Apr. 7, 2020, which is a divisional of U.S. patent application Ser. No. 16/391,041 filed Apr. 22, 2019, now U.S. Pat. No. 10,643,702, issued May 5, 2020, which is a continuation of U.S. patent application Ser. No. 16/022,568, filed Jun. 28, 2018, now U.S. Pat. No. 10,276,241, issued Apr. 30, 2019, which is a continuation of U.S. patent application Ser. No. 15/583,609, filed May 1, 2017, now U.S. Pat. No. 10,014,054, issued Jul. 3, 2018, which is a continuation of U.S. patent application Ser. No. 14/788,629, filed Jun. 30, 2015, now U.S. Pat. No. 9,672,927, issued Jun. 6, 2017, which is a continuation of U.S. patent application Ser. No. 13/784,735, filed Mar. 4, 2013, now U.S. Pat. No. 9,111,592, issued Aug. 18, 2015, which is based upon and claims the benefit of priority from Japanese Patent Application No. 2012-144628, filed Jun. 27, 2012; the entire contents of which are incorporated herein by reference.

FIELD

Embodiments described herein relate to semiconductor storage devices.

BACKGROUND

A NAND-type flash memory in which memory cells are three-dimensionally arranged has been known.

DETAILED DESCRIPTION

Embodiments of the present disclosure provide a semiconductor storage device that can improve the operation speed.

In general, according to one embodiment, the disclosure will be explained with reference to the drawings. In the following explanation, common reference symbols are given to common parts of the drawings.

The semiconductor storage device as an embodiment of the present disclosure includes peripheral circuits, a memory cell array, upper bit lines extending in a first direction, and first and second connecting parts including several contact plugs for making electrical connections between the upper bit lines and the peripheral circuits. The peripheral circuits are disposed on a semiconductor substrate. The memory cell array is disposed above the peripheral circuits and the upper bit lines are disposed above the memory cell array. The memory cell array includes at least a first region and a second region each region including several memory cells respectively laminated on an interlayer dielectric. The regions are sequentially arranged in a first direction. The upper bit lines are electrically connected with the memory cells. The first and second connecting parts are provided with contact plugs respectively arranged in a second direction orthogonal to the first direction, and one of these connecting parts is installed between the first and second regions. The upper bit lines include a first group of upper bit lines, which are connected to the peripheral circuits via the contact plugs of the first connecting part, and a second group of upper bit lines that are connected to the peripheral circuits via the contact plugs of the second connecting part.

1. (Embodiment 1)

The semiconductor storage device of a first embodiment will be explained. In the following, a three-dimensional laminated NAND-type flash memory in which memory cells are laminated on a semiconductor substrate will be mentioned and explained as the semiconductor storage device.

1.1 Constitution of Semiconductor Storage Device

First, the constitution of the semiconductor storage device of this embodiment will be explained.

1.1.1 Entire Constitution of Semiconductor Storage Device

Figure 1:
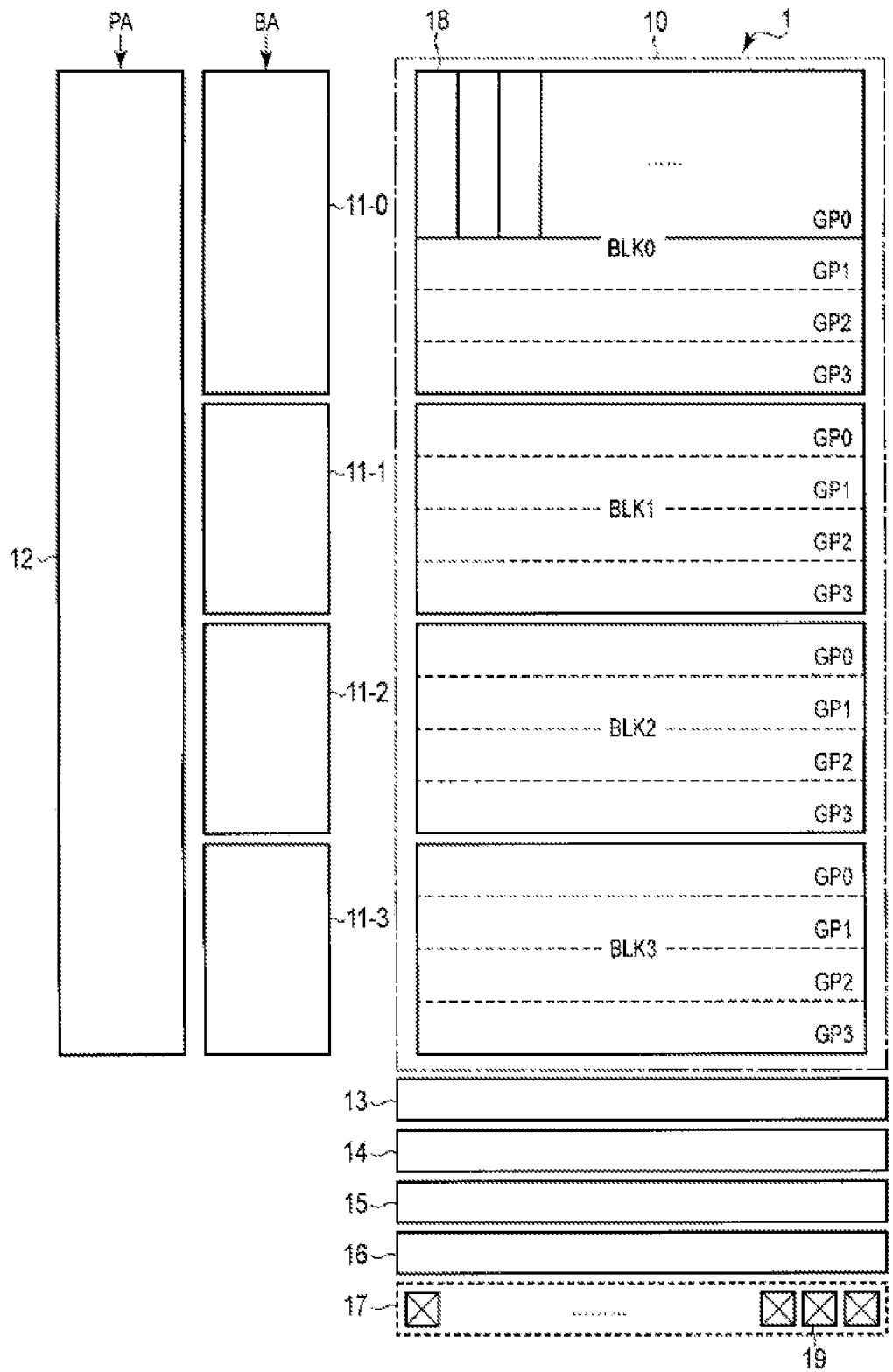
FIG. 1 is a block diagram showing the semiconductor storage device according to a first embodiment.

FIG. 1 is a block diagram showing the semiconductor storage device of this embodiment. As shown in the drawing, an NAND-type flash memory 1 includes memory cell array 10, row decoders 11 (11-0 to 11-3), driver circuit 12, sense amplifiers 13, data latch 14, data control circuit 15, input and output buffer 16, and input and output (input/output) pad group 17.

The memory cell array 10 is provided with several (4 pieces in this example) blocks BLK (BLK0-BLK3) as a set of nonvolatile memory cells. Data in the same block BLK are collectively deleted. Each of the blocks BLK is provided with several (4 pieces in this example) memory groups GP (GP0-GP3) as a set of NAND strings 18 in which memory cells are connected in series. Needless to say, the number of block in the memory array 10 and the number of memory group in the block BLK are arbitrary.

The row decoders 11-0 to 11-3 are respectively installed in accordance with the blocks BLK0-BLK3. In addition, row addresses are decoded, and the corresponding blocks BLK are selected.

The driver circuit 12 supplies a voltage required for write, readout, and deletion of data to the row decoders 11. This voltage is applied to the memory cells by the row decoders 11.

When data are read out, the sense amplifier 13 senses and amplifies the data read out of the memory cells. In addition, when data are written, the sense amplifier transfers the write data to the memory cells.

When data are read out, the data latch 14 temporarily holds the data sensed by the sense amplifier. In addition, when data are written, the data latch temporarily holds the write data and transfers the write data to the sense amplifier 13.

The data control circuit 15 decodes a column address and connects the data latch corresponding to the column address and the input and output buffer 16.

The input and output buffer 16 temporarily holds output data, which are transferred from the data control circuit 15, or input data, which are input via the input and output pad group 17 from the outside.

The input and output pad group 17 is provided with several input and output pads 19. These input and output pads 19 function as input and output terminals for delivery of data between the semiconductor storage device 1 and the outside.

1.1.2 Memory Cell Array 10

Figure 2:
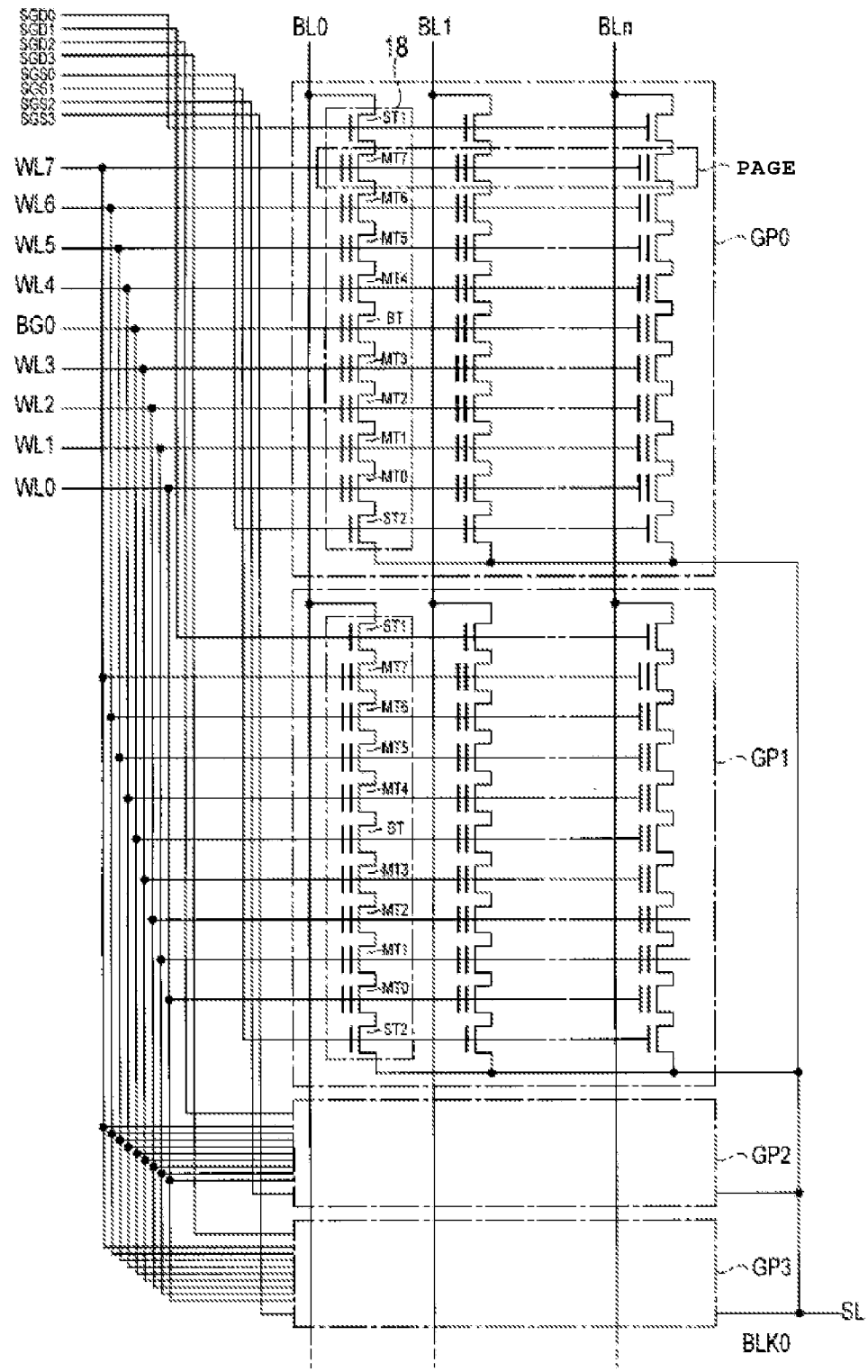
FIG. 2 is a circuit diagram showing a memory cell array according to the first embodiment.

Next, the details of the constitution of the memory cell array 10 will be explained. FIG. 2 is a circuit diagram showing the block BLK0. The blocks BLK1-BLK3 also have a similar constitution.

As shown in the drawing, the block BLK0 includes four memory groups GP. In addition, each memory group GP includes n pieces (where n represents a natural number) of NAND strings 18.

Each of the NAND strings 18, for example, includes 8 pieces of memory cell transistors MT (MT0-MT7), selective transistors ST1 and ST2, and a back gate transistor BT. The memory cell transistor MT is provided with a control gate and a laminated gate including a charge storage layer and holds data in a nonvolatile manner. Here, the number of memory cell transistor MT may be 16 pieces, 32 pieces, 64 pieces, 128 pieces, etc., and the number is not limited to 8. The back gate transistor BT is also provided with a control gate and a laminated gate including a charge storage layer similarly to the memory cell transistor MT. However, the back gate transistor BT does not hold data but functions as a simple current path when data are written and deleted. The memory cell transistor MT and the back gate transistor BT are arranged so that its current path is connected in series between the selective transistors ST1 and ST2. Here, the back gate transistor BT is installed between the memory cell transistors MT3 and MT4. The current path of the memory cell transistor MT7 at one end of this serial connection is connected to one end of a current path of the selective transistor ST1, and the current path of the memory cell transistor MT0 at the other end is connected to one end of a current path of the selective transistor ST2.

The gate of the selective transistor ST1 of each of the memory groups GP0-GP3 is respectively, commonly connected to selective gate lines SGS0-SGS3. The gate of the selective transistor ST1 is respectively, commonly connected to selective gate lines SGS0-SGS3. On the contrary, the control gates of the memory cell transistors MT0-MT7 in the same block BLK0 are respectively, commonly connected to word lines WL0-WL7, and the control gate of the back gate transistor BT is commonly connected to back gate lines BG (respectively BG0-BG3 in the blocks BLK0-BLK3).

In other words, the word lines WL0-WL7 and the back gate lines BG are commonly connected among several memory groups GP0-GP3 in the same block BLK0, whereas the selective gate lines SGD and SGS are independent of each memory group GP0-GP3, even in the same block BLK0.

In addition, of the NAND strings 18 arranged in a matrix form in the memory cell array 10, the other end of the current path of the selective transistor ST1 of the NAND strings 18 in the same row is commonly connected to any of bit lines BL (BL0-BLn, n represents a natural number). In other words, the bit lines BL commonly connect the NAND strings 18 among several blocks BLK. Moreover, the other end of the current path of the selective transistor ST2 is commonly connected to the source line SL. The source line SL, for example, commonly connects the NAND strings 18 among several blocks.

As mentioned above, data of the memory cell transistors MT in the same block BLK are collectively deleted. On the contrary, data are collectively read out and written from and into several memory cell transistors MT commonly connected to any of the word lines WL in any of the memory groups GP of an of the blocks BLK. This unit is called a "page."

Figure 3:
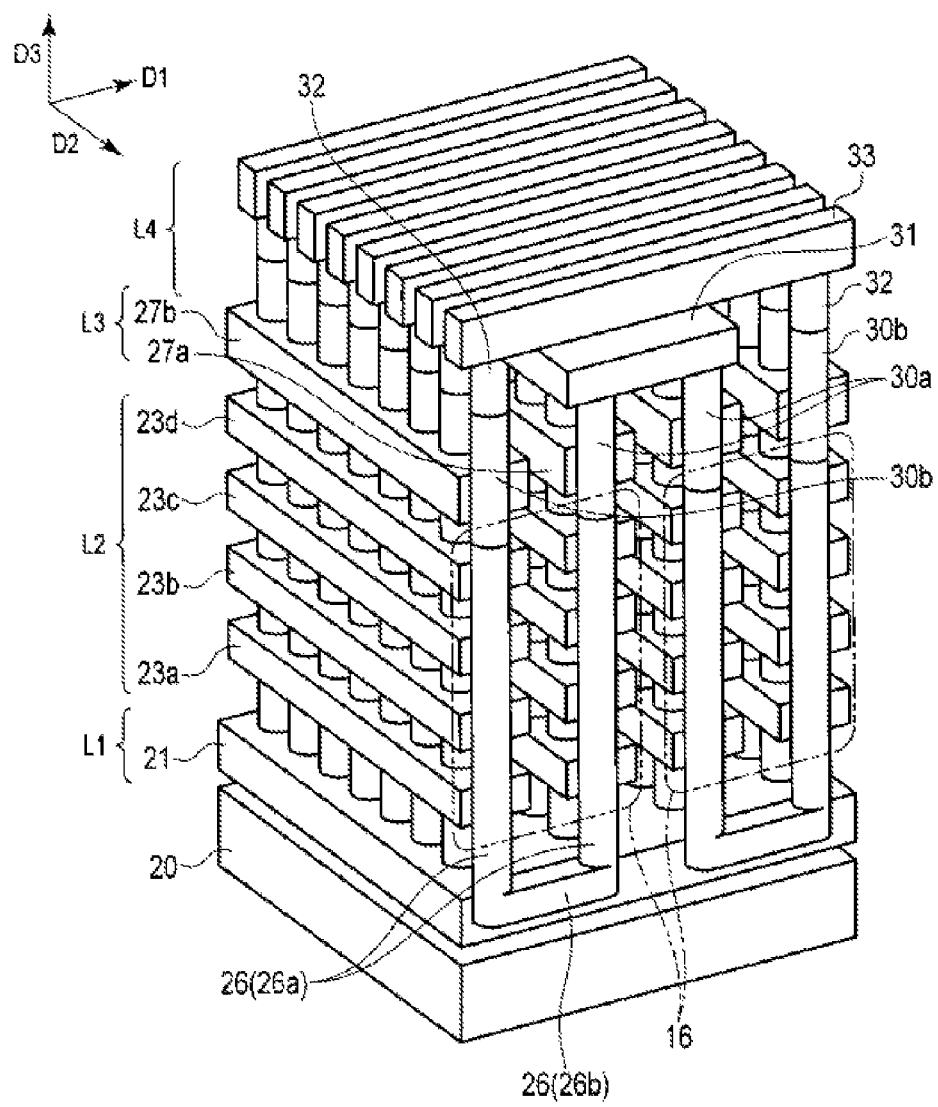
FIG. 3 is an oblique view showing the memory cell array according to the first embodiment.
Figure 4:
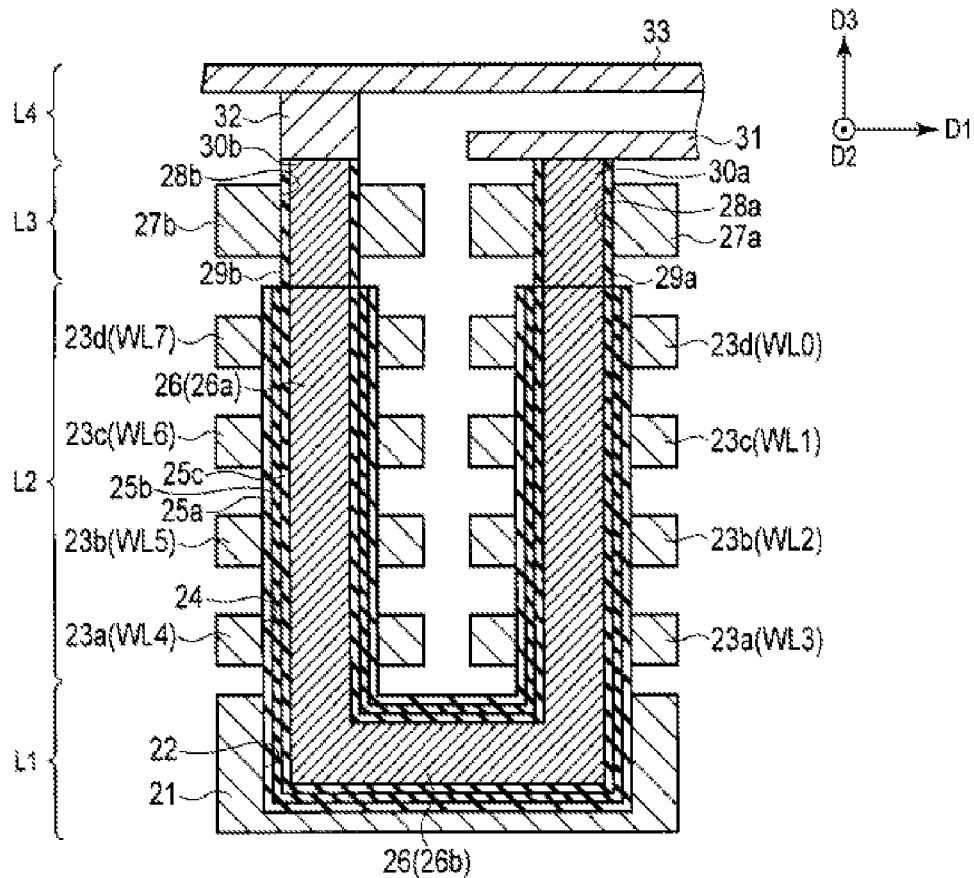
FIG. 4 is a cross section showing the memory cell array according to the first embodiment.

Next, a three-dimensional laminated structure of the memory cell array 10 will be explained with reference to FIGS. 3 and 4. FIGS. 3 and 4 are an oblique view and a cross section showing the memory cell array 10.

As shown in the drawings, the memory cell array 10 is installed on a semiconductor substrate 20. In addition, the memory cell array 10 has back gate transistor layer L1, memory cell transistor layer L2, selective transistor layer L3, and wiring layer L4 sequentially formed on the semiconductor substrate 20.

The back gate transistor layer L1 functions as the back gate transistor BT. The memory cell transistor layer L2 functions as the memory cell transistors MT0-MT7 (NAND strings 18). The selective transistor layer L3 functions as the selective transistors ST1 and ST2. The wiring layer L4 functions as the source line SL and the bit line BL.

The back gate transistor layer L1 has a back gate conductive layer 21. The back gate conductive layer 21 is formed so that it is two-dimensionally extended in a first direction and a second direction parallel with the semiconductor substrate 20 (that is, the first direction and the second direction are orthogonal to a third direction in which the memory cells are laminated). The back gate conductive layer 21 is divided for each block BLK. The back gate conductive layer 21, for example, is formed of polycrystalline silicon. The back gate conductive layer 21 functions as the back gate line BG.

In addition, the back gate conductive layer 21, as shown in FIG. 4, has a back gate hole 22. The back gate hole 22 is formed in the back gate conductive layer 21. The back gate hole 22 is formed in an approximately rectangular shape in which the first direction is the longitudinal direction from the upper surface.

The memory cell transistor layer L2 is formed above the back gate conductive layer L1. The memory cell transistor layer L2 has word line conductive layers 23a-23d. The word line conductive layers 23a-23d are laminated via an interlayer dielectric (not shown in the figure). The word line conductive layers 23a-23d are formed at a prescribed pitch in the first direction and in a stripe shape extending in the second direction. The word line conductive layers 23a-23d, for example, are formed of polycrystalline silicon. The word line conductive layer 23a functions as a control gate (word lines WL3 and WL4) of the memory cell transistors MT3 and MT4, the word line conductive layer 23b functions as a control gate (word lines WL2 and WL5) of the memory cell transistors MT2 and MT5, the word line conductive layer 23c functions as a control gate (word lines WL1 and WL6) of the memory cell transistors MT1 and MT6, and the word line conductive layer 23d functions as a control gate (word lines WL0 and WL7) of the memory cell transistors MT0 and MT7.

In addition, the memory cell transistor layer L2, as shown in FIG. 4, has a memory hole 24. The memory hole 24 is formed so that it penetrates through the word line conductive layers 23a-23d. The memory hole 24 is formed so that it is matched with the end vicinity of the first direction of the back gate hole 22.

Moreover, the back gate transistor layer L1 and the memory cell transistor layer L2, as shown in FIG. 4, has block insulating layer 25a, charge storage layer 25b, tunnel insulating layer 25c, and semiconductor layer 26. The semiconductor layer 26 functions as a body (a back gate of each transistor) of the NAND strings 18.

The block insulating layer 25a, as shown in FIG. 4, is formed at a prescribed thickness at the sidewall facing the back gate hole 22 and the memory hole 24. The charge storage layer 25b is formed at a prescribed thickness on the side surface of the block insulating layer 25a. The tunnel insulating layer 25c is formed at a prescribed thickness on the side surface of the charge storage layer 25b. The semiconductor layer 26 is formed so that it contacts with the side surface of the tunnel insulating layer 25c. The semiconductor layer 26 is formed so that the back gate hole 22 and the memory hole 24 are embedded into it.

The semiconductor layer 26 is formed in a U shape from the second direction. In other words, the semiconductor layer 26 has a pair of columnar parts 26a extending in the direction perpendicular to the surface of the semiconductor substrate 20 and a connecting part 26b for connecting the lower ends of a pair of columnar parts 26a.

The block insulating layer 25a and the tunnel insulating layer 25c, for example, are formed of silicon oxide (SiO$_2$). The charge storage layer 25b, for example, is formed of silicon nitride (SiN). The semiconductor layer 26 is formed of polycrystalline silicon. These block insulating layer 25a, charge storage layer 25b, tunnel insulating layer 25c, and semiconductor layer 26 forma MONOS type transistor functioning as the memory transistor MT.

In other words, in the constitution of the back gate transistor layer L1, the tunnel insulating layer 25c is formed so that it encloses the connecting part 26b. The back gate conductive layer 21 is formed so that it encloses the connecting part 26b.

In addition, in the constitution of the memory transistor layer L2, the tunnel insulating layer 25c is formed so that it encloses the columnar parts 26a. The charge storage layer 25b is formed so that it encloses the tunnel insulating layer 25c. The block insulating layer 25a is formed so that it encloses the charge storage layer 25b. The word line conductive layers 23a-23d are formed so that they enclose the block insulating layers 25a-25c and the columnar parts 26a.

The selective transistor layer L3, as shown in FIGS. 3 and 4, has conductive layers 27a and 27b. The conductive layers 27a and 27b are formed in a stripe shape extending in the second direction so that they have a prescribed pitch in the first direction. A pair of conductive layers 27a and a pair of conductive layer 27b are arranged in an alternate fashion in the first direction. The conductive layers 27a are formed in the upper layers of one columnar part 26a, and the conductive layers 27b are formed in the upper layer of the other columnar part 26a.

The conductive layers 27a and 27b are formed of polycrystalline silicon. The conductive layers 27a function as the gate (selective gate line SGS) of the selective transistor ST2, and the conductive layers 27b function as the gate (selective gate line SGD) of the selective transistor ST1.

The selective transistor layer L3, as shown in FIG. 4, has holes 28a and 28b. The holes 28a and 28b respectively penetrate through the conductive layers 27a and 27b. In addition, the holes 28a and 28b are respectively matched with the memory hole 24.

The selective transistor layer L3, as shown in FIG. 4, is provided with gate insulating layers 29a ad 29b and semiconductor layers 30a and 30b. The gate insulating layers 29a and 29b are respectively formed at the sidewalls facing the holes 28a and 28b. The semiconductor layers 30a and 30b are formed in a columnar shape extending in the direction perpendicular to the surface of the semiconductor substrate 20 so that they respectively contact with the gate insulating layers 29a and 29b.

The gate insulating layers 29a and 29b, for example, are formed of silicon oxide (SiO$_2$). The semiconductor layers 30a and 30b, for example, are formed of polycrystalline silicon.

In other words, in the constitution of the selective transistor layer L3, the gate insulating layer 29a is formed so that it encloses the columnar semiconductor layer 30a. The conductive layer 27a is formed so that it encloses the gate insulating layer 29a and the semiconductor layer 30a. In addition, the gate insulating layer 29b is formed so that it encloses the columnar semiconductor layer 30b. The conductive layer 27b is formed so that it encloses the gate insulating layer 29b and the semiconductor layer 30b.

The wiring layer L4, as shown in FIGS. 3 and 4, is formed in the upper layer of the selective transistor layer L3. The wiring layer L4 has source line layer 31, plug layers 32, and bit line layers 33.

The source line layer 31 is formed in a plate shape extending in the second direction. The source line layer 31 is formed so that it is in contact with the upper surfaces of a pair of semiconductor layers 27a in the first direction. The plug layers 32 are formed so that they are in contact with the upper surfaces of the semiconductor layers 27b and extend in the direction perpendicular to the surface of the semiconductor substrate 20. The bit line layers 33 are formed at a prescribed pitch in the second direction and in a stripe shape extending in the first direction. The bit line layers 33 are formed so that they are in contact with the upper surfaces of the plug layers 32. The source line layer 31, plug layers 32, and bit line layers 33, for example, are formed of a metal such as tungsten (W). The source line layer 31 functions as the source line SL explained in FIGS. 1 and 2, and the bit line layers 33 function as the bit lines BL.

Figure 5:
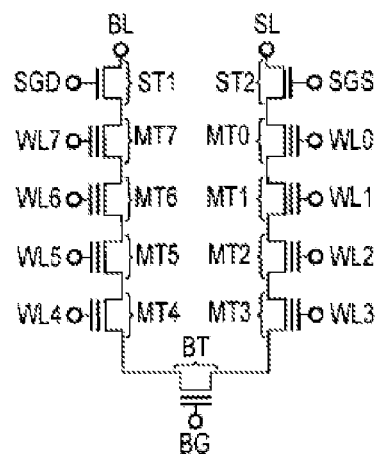
FIG. 5 is a circuit diagram showing an NAND string according to the first embodiment.

An equivalent circuit of the NAND strings 18 depicted in FIGS. 3 and 4 is shown in FIG. 5. As shown in the drawing, the NAND string 18 has the selective transistors ST1 and ST2, memory cell transistors MT0-MT7, and back gate transistor BT. As mentioned above, the memory cell transistors MT are connected in series between the selective transistors ST1 and ST2. The back gate transistor BT is connected in series between the memory cell transistors MT3 and MT4. When data are written and read out, the back gate transistor BT is always in an on-state.

The control gate of the memory cell transistor MT is connected to the word lines WL, and the control gate of the back gate transistor BT is connected to the back gate line BG. In addition, a set of several NAND strings 18 arranged in the second direction in FIG. 3 corresponds to the memory group GP explained in FIG. 2.

1.1.3 Row Decoder 11

Figure 6:
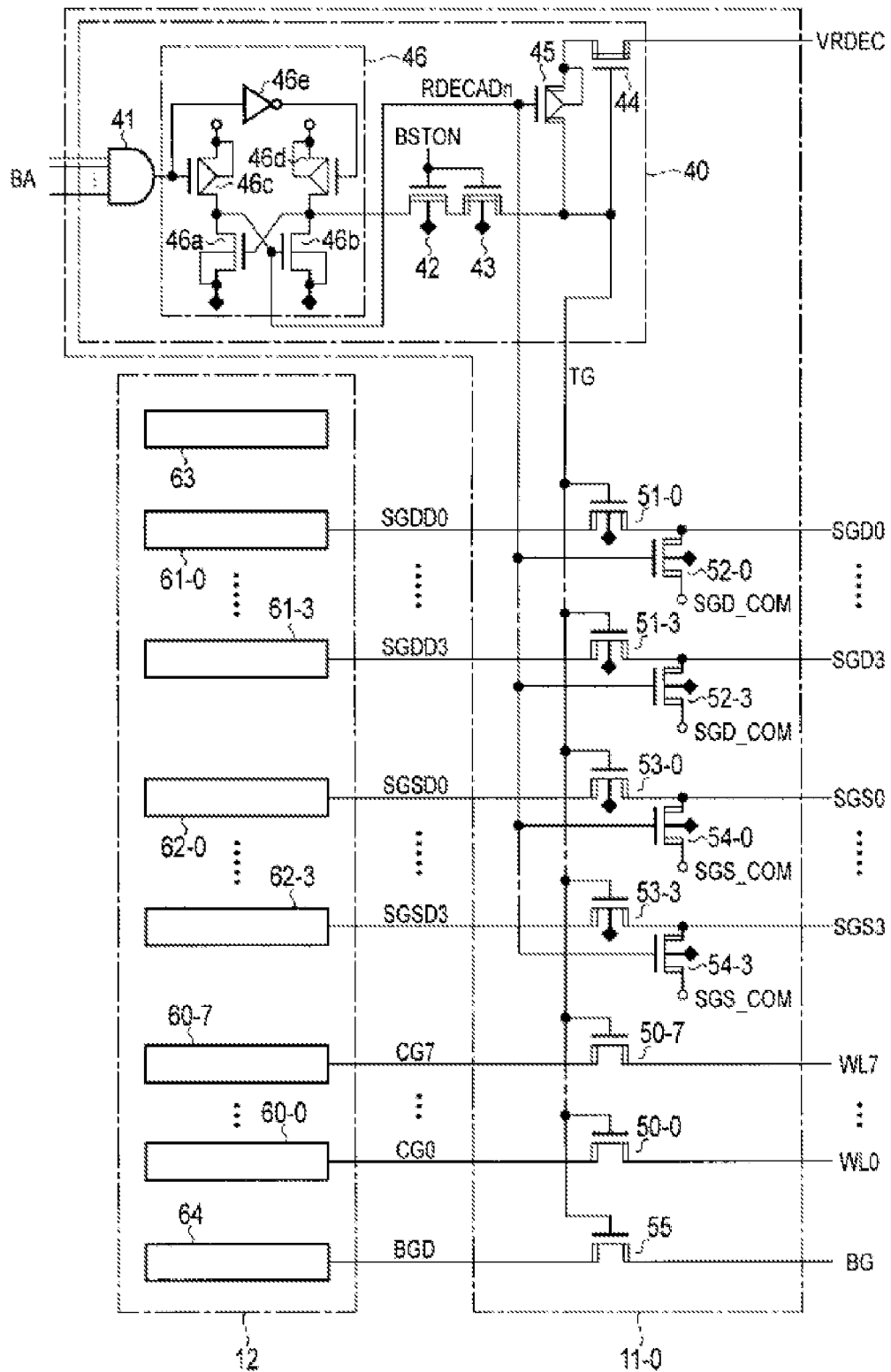
FIG. 6 is a block diagram showing a row decoder and a driver circuit according to the first embodiment.

Next, the constitution of the row decoder 11 will be explained. The row decoders 11-0 to 11-3 are respectively installed in relation to the blocks BLK0-BLK3 and installed to select or not to select the blocks BLK0-BLK3. FIG. 6 shows the constitution of the row decoders 11-0 and the driver circuit 12. Here, the constitution of the row decoders 11-1 to 11-3 is also similar to that of the row decoder 11-0.

As shown in the drawing, the row decoder 11 is provided with block decoder 40 and high-breakdown voltage n channel enhancement type (E-type: the threshold is positive) MOS transistors 50-54 (50-0 to 50-7, 51-0 to 51-3, 52-0 to 52-3, 53-0 to 53-3, and 54-0 to 54-3), and 55. Any of the transistors 50-54 is a high breakdown voltage-type, the impurity concentration of a channel region is equal, and its threshold voltage is also equal.

<Block Decoder 40>

First, the block decoder 40 will be explained. As shown in FIG. 6, the block decoder 40 is provided with AND gate 41, low-breakdown voltage n channel depletion-type MOS transistor 42, high-breakdown voltage n channel depletion-type (D type: the threshold is negative) MOS transistors 43 and 44, high-breakdown voltage p channel E-type MOS transistor 45, and level shifter 46.

The AND gate 41 carries out an AND arithmetic of each bit of a block address BA which is given from the outside. In case the block address BA indicates the corresponding block BLK0 of the row decoder 11-0, the AND gate 41 outputs "H" level.

The level shifter 46 level-shifts and outputs the output of the AND gate 41. The level shifter 46 outputs a level-shifted signal, in which the output of the AND gate 41 is inverted, as a signal RDECADn. In addition, the level shifts supplies a level-shifted signal, in which the output of the AND gate 41 is not inverted, to the transistor 42. In other words, the level shift 46 is provided with low-breakdown voltage n channel E-type MOS transistors 46a and 46b, low-breakdown voltage p channel E-type MOS transistors 46 and 46d, and inverter 46e.

The inverter 46e inverts the output of the AND gate 41. In the transistor 46c, its gate is connected to an output node of the AND gate 41, and a power supply voltage Vdd is applied to its source and back gate. In the transistor 46d, its gate is connected to an output node of the inverter 46e, and the power supply voltage Vdd is applied to its source and back gate. In the transistor 46a, its drain is connected to the drain of the transistor 46c, a negative voltage VBB is applied to its source and back gate, and its gate is connected to the drain of the transistor 46d. In the transistor 46b, its drain is connected to the drain of the transistor 46d, the negative voltage VBB is applied to its source and back gate, and its gate is connected to the drain of the transistor 46c. In addition, the potential of the drains of the transistors 46a and 46c and the gate of the transistor 46b turns to the signal RDECADn.

In the transistor 42, one end of its current path is connected to the drains of the transistors 46d and 46b and the gate of the transistor 46a, and a signal BSTON is transmitted to its gate. In addition, in the transistor 43, one end of its current path is connected to the other end of the current path of the transistor 42, the other end of the current path is connected to a signal line TG, and the signal BSTON is transmitted to its gate. The signal BSTON is a signal that is asserted ("H" level) when address information of the block decoder 40 is introduced.

In the transistor 45, one end of its current path is connected to the signal line TG, the other end of the current path is connected to its back gate, and the signal RDECADn is input into its gate. In the transistor 44, a voltage VRDEC is applied to one end of its current path, the other end is connected to the other end of the current path of the transistor 45, and its gate is connected to the signal line TG.

When data are written, readout, and deleted, if the block address BA matches with the corresponding block BLK0, the transistors 44 and 45 are set to an on-state, applying the voltage VRDEC ("H" level in this example) to the signal line TG. On the other hand, if the block address BA does not match with the corresponding block BLK0, the MOS transistors 44 and 45 are set to an off-state, the negative voltage VBB ("L" level) to the signal line TG.

<Transistor 50>

Next, the transistor 50 will be explained. The transistor 50 transfers a voltage to the word lines WL of the selective blocks BLK. In the transistors 50-0 to 50-7, one ends of their current paths are respectively connected to the word lines WL0-WL7 of the corresponding block BLK0, and the other ends are respectively connected to signal lines CG0-CG7. Their gates are commonly connected to the signal lines TG.

Therefore, for example, in the row decoder 11-0 corresponding to the selective block BLK0, the transistors 50-0 to 50-7 are set to an on-state, connecting the word lines WL0-WL7 to the signal lines CG0-CG7. On the other hand, in the row decoders 11-1 to 11-3 corresponding to the nonselective blocks BLK1-BLK3, the transistors 50-0 to 50-7 are set to an off-state, separating the word lines WL0-WL7 from the signal lines CG0-CG7.

<Transistors 51 and 52>

Next, the transistors 51 and 52 will be explained. The transistors 51 and 52 transfer a voltage to the selective gate lines SGD. In the transistors 51-0 to 51-3, one ends of their current paths are respectively connected to the selective gate lines SGD0-SGD3 of the corresponding block BLK0, the other ends are connected to the signal lines SGDD0-SGDD3, their gates are commonly connected to the signal line TG, and the negative voltage VBB is applied to their back gates. In addition, in the transistors 52-0 to 52-3, one ends of their current paths are respectively connected to the selective gate lines SGD0-SGD3 of the corresponding block BLK0, the other ends are connected to a node SGD_COM, the signal RDECADn is transmitted to their gates, and the negative voltage VBB is applied to their back gates. The node SGD_COM is a voltage such as negative VBB that sets the selective transistor ST1 to an off-state.

Therefore, for example, in the row decoder 11-0 corresponding to the selective block BLK0, the transistors 51-0 to 51-3 are set to an on-state, and the transistors 52-0 to 52-3 are set to an off-state. Thereby, the selective gate lines SGD0-SGD3 of the selective block BLK0 are connected to the signal lines SGDD0-SGDD3.

On the other hand, in the row decoders 11-1 to 11-3 corresponding to the nonselective blocks BLK1-BLK3, the transistors 51-0 to 51-3 are set to an off-state, and the transistors 52-0 to 52-3 are set to an on-state. Therefore, the selective gate lines SGD0-SGD3 of the nonselective blocks BLK1-BLK3 are connected to the node SGD_COM.

<Transistors 53 and 54>

The transistors 53 and 54 transfer a voltage to the selective gate lines SGS. Their connection and operation are equivalent to the substitution of the selective gate lines SGD for the selective gate lines SGS in the transistors 51 and 52.

In other words, in the row decoder 11-0 corresponding to the nonselective block BLK0, the transistors 53-0 to 53-3 are set to an on-state, and the transistors 54-0 to 54-3 are set to an off-state. On the other hand, in the row decoders 11-1 to 11-3 corresponding to the selective blocks BLK1-BLK3, the transistors 51-0 to 51-3 are set to an off-state, and the transistors 52-0 to 52-3 are set to an on-state.

<Transistor 55>

Next, the transistor 55 will be explained. The transistor 55 transfers a voltage to the back gate lines BG. In the transistor 55, one end of its current path is connected to the back gate line BG0 of the corresponding block BLK0, the other end is connected to the signal line BGD, and its gate is commonly connected to the signal line TG.

Therefore, in the row decoder 11-0 corresponding to the selective block BLK0, the transistor 55 is set to an on-state, and in the row decoders 11-1 to 11-3 corresponding to the selective blocks BLK1-BLK3, the transistor 55 is set to an off-state.

1.1.4 Driver Circuit 12

Next, the constitution of the driver circuit 12 will be explained. The driver circuit 12 transfers a voltage required for write, readout, and deletion of data to each of the signal lines CG0-CG7, SGDD0-SGDD3, SGSD0-SGSD3, and BGD.

As shown in FIG. 6, the driver circuit 12 is provided with CG drivers 60 (60-0 to 60-7), SGD drivers 61 (61-0 to 61-3), SGS drivers 62 (62-0 to 62-3), BG driver 64, and voltage driver 63.

The voltage driver 63 generates a voltage that is used in the block decoder 40 and the CG drivers 60. The CG drivers 60-0 to 60-7 respectively transfer a required voltage to the signal lines CG0-CG7 (word lines WL0-WL7). The SGD drivers 61-0 to 61-3 respectively transfer a required voltage to the signal lines SGDD0-SGDD3 (selective gate lines SGD0-SGD3). The SGS drivers 62-0 to 62-3 respectively transfer a required voltage to the signal lines SGSD0-SGSD3 (selective gate lines SGS0-SGS3). The BG driver 64 transfers a required voltage to the back gate lines BG.

1.1.5 Sense Amplifier 13

Figure 7:
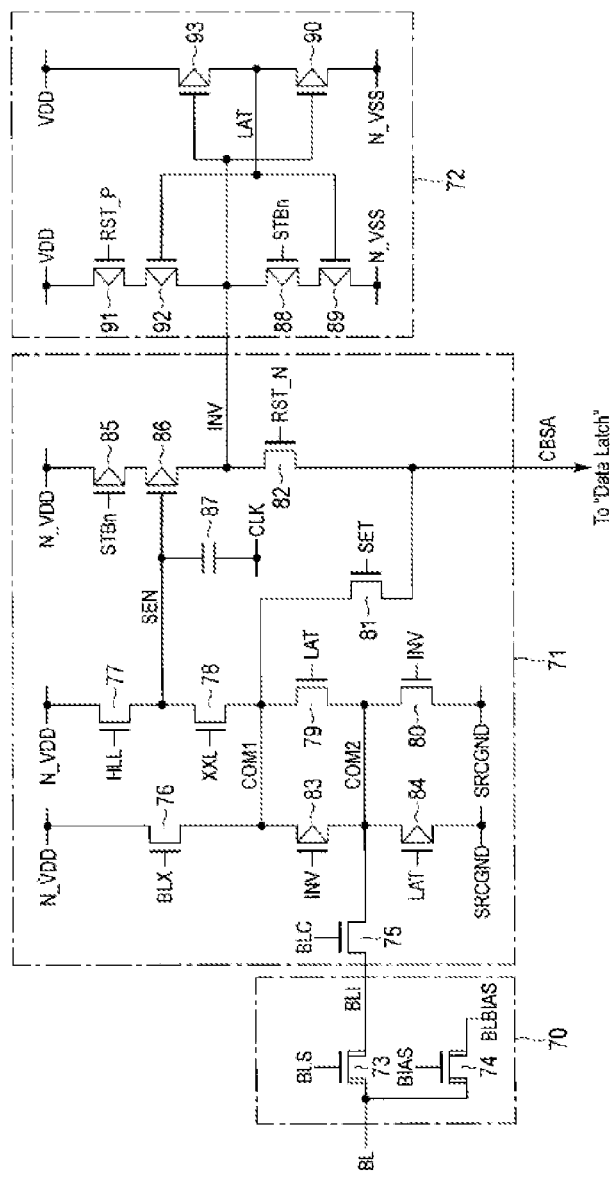
FIG. 7 is a circuit diagram showing a sense amplifier according to the first embodiment.

Next, the constitution of the sense amplifier 13 will be explained with reference to FIG. 7. FIG. 7 is a circuit diagram showing the sense amplifier 13. The constitution shown in FIG. 7 is connected to each bit line BL.

As shown in the drawing, the sense amplifier 13 is generally provided with bit line hookup part 70, sense amplifier part 71, and a data holding part 72.

The bit line hookup part 70 is provided with high breakdown voltage-type n channel MOS transistors 73 and 74. In the transistor 73, a signal BLS is transmitted to its gate, and one end of its current path is connected to the bit line BL, and the other end is connected to a node BLI. In the transistor 74, a signal BIAS is transmitted to its gate, one end of its current path is connected to the corresponding bit line BL, and the other end of a potential-fixed node BLBIAS is applied to the other end.

The sense amplifier part 71 is provided with low breakdown voltage-type n channel MOS transistors 75-82, low breakdown voltage-type p channel MOS transistors 83-86, and capacitor element 87.

In the MOS transistor 75, one end of its current path is connected to the node BLI, the other end is connected to a node COM2, and a signal BLC is transmitted to its gate.

In the MOS transistor 84, one end of its current path is connected to the node COM2, the other end is connected to a node SRCGND (for example, 0 V), and its gate is connected to a node LAT. In the MOS transistor 80, one end of its current path is connected to the node COM2, the other end is connected to a node SRC_GND, and its gate is connected to a node INV. In the MOS transistor 83, one end of its current path is connected to the node COM2, the other end is connected to a node COM1, and its gate is connected to the INV. In the MOS transistor 79, one end of its current path is connected to the node COM2, the other end is connected to the node COM1, and its gate is connected to the node LAT. In the MOS transistor 81, one end of its current path is connected to the node COM1, the other end is connected to a common bus CBSA, and a signal SET is input into its gate. The common bus CBSA is a bus that connects the sense amplifier part 71 and the data latch 14. In the MOS transistor 76, one end of its current path is connected to a node N_VDD to which the power supply voltage VDD is applied, the other end is connected to the node COM1, and a signal BLX is input into its gate. In the MOS transistor 78, one end of its current path is connected to a node SEN, the other end is connected to the COM1, and a signal XXL is input into its gate. In the MOS transistor 77, one end of its current path is connected to the node N_VDD, the other end is connected to the node SEN, and a signal HLL is input into its gate.

In the capacitor element 87, one electrode is connected to the node SEN, and a clock is input into the other electrode.

In the MOS transistor 82, one end of its current path is connected to the node INV, the other end is connected to the common bus CBSA, and a signal RST_N is input into its gate. In the MOS transistor 86, one end of its current path is connected to the node INV, and its gate is connected to the node SEN. In the MOS transistor 85, one end of its current path is connected to the node N_VIM, the other end is connected to the other end of the current path of the MOS transistor 86, and a signal STBn is input into its gate.

The data holding part 72 latches data at the node INV as a connecting node of the MOS transistors 82 and 86. In other words, the data holding part 72 is provided with n channel MOS transistors 88-90 and p channel MOS transistors 91-93.

In the MOS transistor 88, one end of its current path is connected to the node INV, and the signal STBn is input into its gate. In the MOS transistor 89, one end of its current path is connected to a node N_VSS, the other end is connected to the other end of the current path of the MOS transistor 88, and its gate is connected to the node LAT. A voltage VSS (for example, 0 V) is applied to the node N_VSS. In the MOS transistor 92, one end of its current path is connected to the node INV, and its gate is connected to the node LAT. In the MOS transistor 91, one end of its current path is connected to the node N_VDD, the other end thereof is connected to the other end of current path of the MOS transistor 92, and a signal RST P is applied to the gate. In the MOS transistor 90, one end of its current path is connected to the node N_VSS, the other end is connected to the node LAT, and its gate is connected to the node INV. In the MOS transistor 93, one end of its current path is connected to the node N_VDD, the other end is connected to the node LAT, and its gate is connected to the node INV.

The signals SET and RST_N are turned to "H" at a time of a reset operation, so that the nodes COM1 and INV are turned to "L" level (0 V) and the node LAT is turned to "H" level (VDD). On the other hand, at a time of an ordinary operation, these signals are turned to "L" level, setting the transistors 81 and 82 to an off-state. In addition, the signal RST_N is turned to "H" level when data of the sense amplifier 13 are transferred to the data latch 14. Moreover, the signal RST P can be turned to "H" at the time of the reset operation and turned to "L" level at the time of the ordinary operation.

In the constitution, when data are written, the signal BLS is turned to "H" level, and the bit lines BL are respectively connected to the corresponding sense amplifier parts 71. In addition, the signal BLC is turned to "H" level, setting the transistor 75 to an on-state. The signal BIAS is turned to "L" level, setting the transistor 74 to an off-state. Moreover, write data are transferred to the data holding part from the data latch 14. In the sense amplifiers 13 corresponding to selected bit lines (bit lines corresponding to memory cells whose threshold is to be raised by injecting electric charges), the node INV="L," and the node LAT="L." Therefore, the transistors 83 and 79 are set to an off-state, and the transistors 84 and 80 are set to an on-state, applying 0 V to the selective bit lines. In the sense amplifiers 13 corresponding to nonselected bit lines, the node INV="L," and the node LAT="H." Therefore, the transistors 84 and 80 are set to an off-state, and the transistors 83 and 79 are turned to an on-state. As a result, nonselected bit lines are charged up to VDD by the transistor 76.

Data are read out twice. At the time of the first readout, the signal BLS in all the sense amplifiers 13 is turned to "H" level, so that the bit lines BL are respectively connected to the corresponding sense amplifier parts 71. In addition, the signal BLC is turned to "H" level, setting the transistor 75 to an on-state. Next, the transistor 76 charges the bit lines BL via the current paths of the transistors 83 and 79 and the nodes COM and COM2. The potential of the bit lines BL is set to a potential VBL (for example, 0.5 V) by the transistor 75. In addition, the capacitor element 87 is charged by the transistor 77, raising the potential of the node SEN.

If the corresponding memory cell is in an on-state, the potential of the node SEN is lowered, and the transistor 86 is set to an on-state. Next, the signal STBn is turned to "H" level, so that the node INV is turned to "H" and the node LAT is turned to "L." As a result, the transistors 84 and 80 are set to an on-state, fixing the bit line BL to 0 V. On the other hand, if the corresponding memory cell is in an off-state, the potential of the node SEN is not lowered, and the transistor 86 is in an off-state. Therefore, the node INV is turned to "L," and the node LAT maintains "H."

The second readout is carried out only on the bit line that decided the corresponding bit line has been in an off-state in the first readout. The operation of the sense amplifier 13 corresponding to this bit line is similar to that of the first readout. On the other hand, for the bit line that decided the corresponding memory cell has been in an on-state in the first readout, the transistor 74 is set to an on-state in the corresponding sense amplifier 13, so that the bit line BL is connected to the node BLBIAS, fixing the potential.

Next, the sense amplifier 13 selected by the data control circuit 15, the transistor 82 is set to an on-state, so that data in the holding circuit 72 are transferred to the data latch 14 via the common bus CBSA.

1.2 Operation of Semiconductor Storage Device 1

Next, the operation of the NAND-type flash memory 1 with the constitution mentioned above will be briefly explained.

1.2.1 Write Operation

Figure 8:
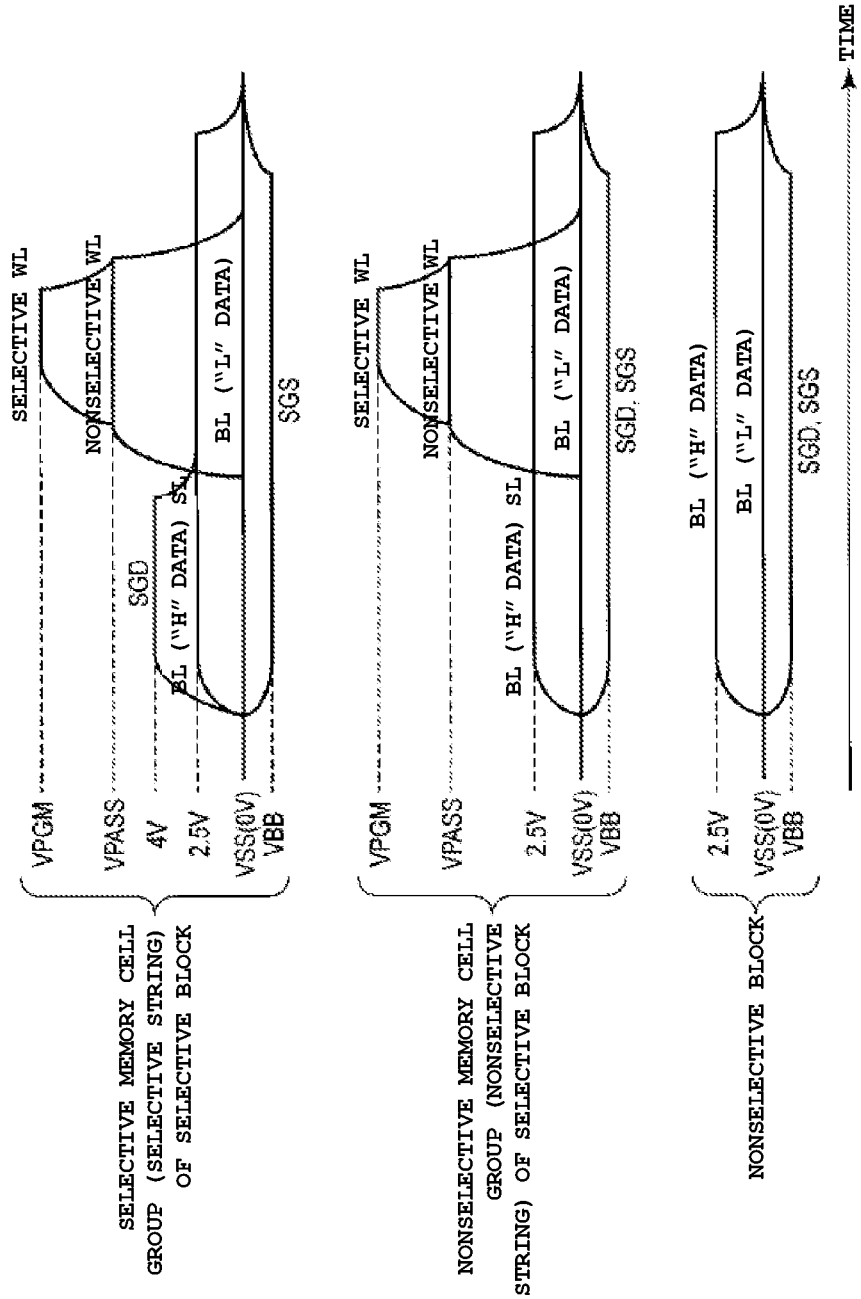
FIG. 8 is a timing chart showing various kinds of signals according to the first embodiment.

First, a write operation will be explained with reference to FIG. 8. FIG. 8 is a timing chart showing the potential of each wiring at a time of a write operation.

As shown in FIG. 8, first, the sense amplifier 13 transfers write data to each bit line BL. In case the threshold is raised by injecting electric charges into the charge storage layer, "L" level (for example, VSS=0 V) is applied to the bit lines BL, and otherwise, "H" level (for example, VDD=2.5 V) is applied. In addition, for example, 2.5 V is applied to the source line SL by a source line driver not shown in the drawing.

Moreover, in the row decoder 11, the block address BA is decoded by the block decoder 40, and in selective blocks, TG="H" level, and the transistors 50, 51, and 53 of the row decoder 11 are set to an on state. Furthermore, in the row decoder 11 corresponding to the nonselective blocks, TG="L" level (for example, VBB), setting the transistors 50, 51, and 53 to an off-state and the transistors 52 and 54 to an on-state.

Therefore, in the nonselective blocks, the negative voltage VBB is transferred to the selective gate lines SGD and SGS by the transistors 52 and 54, cutting off both the selective transistors ST1 and ST2.

On the other hand, in the selective blocks, the voltage VSGD (for example, 4 V) is transferred to the selective gate line SGD corresponding to a memory group including a selective page by the SGD driver 61 and the SGS driver 62, so that the negative voltage VBB is transferred to the selective gate line SGS. Thereby, in the memory group, the selective transistor ST1 is set to an on-state, and the selective transistor ST2 is set to an off-state. The negative voltage VBB is transferred to the selective gate lines SGD and SGS corresponding to the other memory groups. Therefore, in these memory groups, both the selective transistors ST1 and ST2 are set to an off-state.

Next, the voltage VSGD is lowered to about 2.5 V from 4 V. This voltage turns on the selective transistor ST1, when "L" data are transferred to the bit line BL, and is cut off when "H" data are transferred.

Next, the CG driver 60 transfers the voltage to each signal line CG. In other words, the CG driver 60 corresponding to selective word lines transfers VPGM, and the CG driver 60 corresponding to nonselective word lines transfers VPASS (or VISO). VPGM is a high voltage for turning on the memory cell transistors, regardless of holding data (however, VPASS<VPGM). VISO is a voltage for turning off the memory cell transistors, regardless of holding data (VISO<VPASS). Therefore, in the selective blocks, since the transistor 50 is set to an on-state, these voltages are transferred to the word lines WL0-WL7. On the other hand, in the nonselective blocks, since the transistor 50 is set to an off-state, these voltages are not transferred to the word lines WL. In other words, the word lines WL0-WL7 of the nonselective blocks are electrically in a floating state.

In this manner, in the selective memory cells, the voltage VPGM is applied to the control gate, and the channel is turned to 0 V. Therefore, electric charges are injected into the charge storage layer, raising the threshold level of the selective memory cells. In the nonselective memory cells, the channel is electrically floated, so that its potential is raised by coupling with the periphery. The threshold level of the selective memory cells is not changed.

1.2.2 Readout Operation

Figure 9:
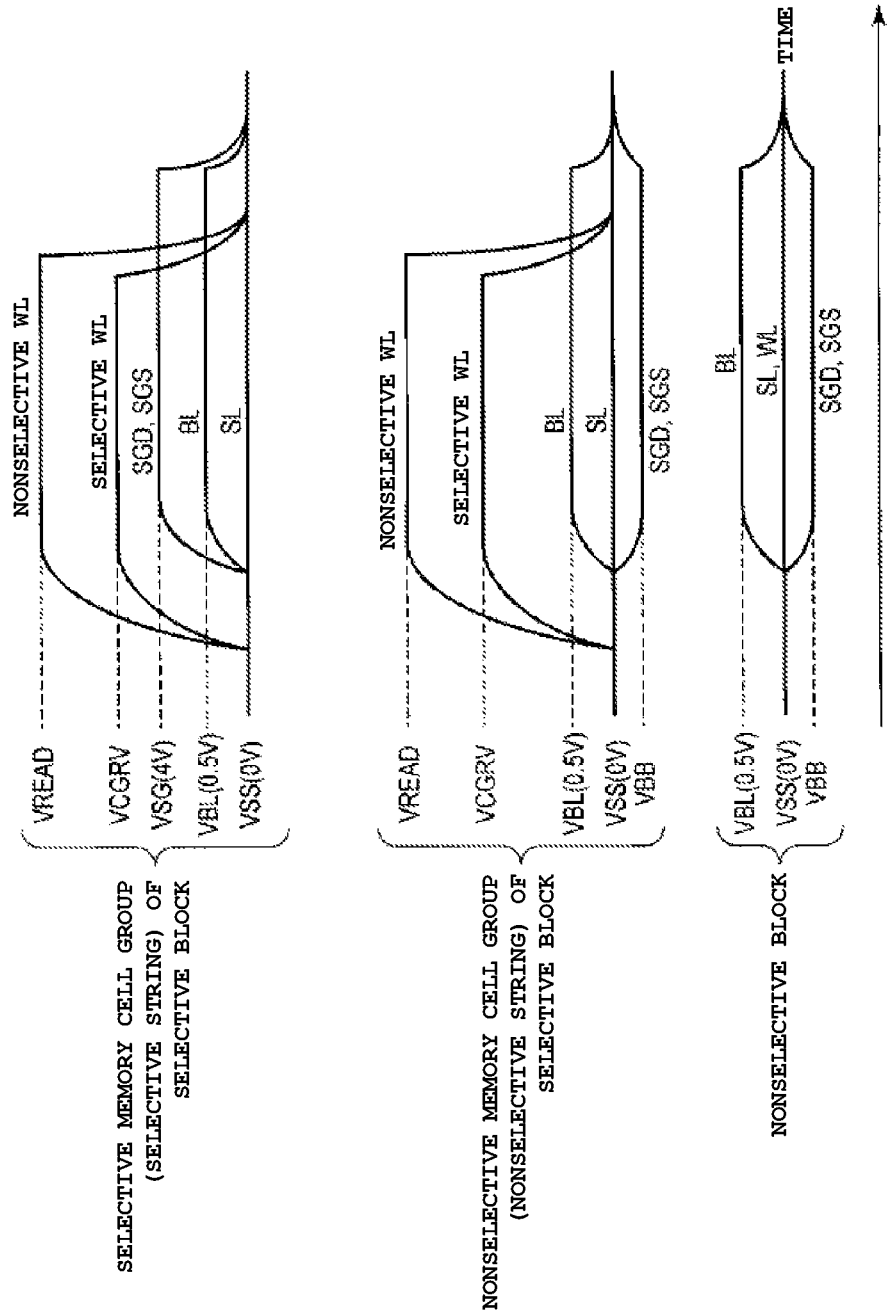
FIG. 9 is a timing chart showing various kinds of signals according to the first embodiment.

Next, a readout operation will be explained with reference to FIG. 9. FIG. 9 is a timing chart showing the potential of each wiring at a time of a readout operation.

As shown in FIG. 9, first, the CG driver 60 generates voltages VCGRV and VREAD. The voltage VCGRV is a voltage to be applied to the selective word lines and corresponds to desired readout data (threshold level). The voltage VREAD is a voltage for turning on the memory cell transistors, regardless of holding data (VREAD>VCGRV).

In the selective blocks, since the transistor 50 is set to an on-state similarly to the write operation, these voltages VCGRV and VREAD are transferred to the word lines WL. On the other hand, in the nonselective blocks, since the transistor 50 is set to an off-state, the word lines WL are electrically floated.

Next, the voltage is transferred to the selective gate lines SGD and SGS. In the selective memory groups of the selective blocks, the voltages VSGD and VSGS (for example, 4 V) are transferred to the selective gate lines SGD and SGS by the transistors 51 and 53. Therefore, the selective transistors ST1 and ST2 are set to an on-state. In the nonselective memory groups of the selective blocks, the voltage VBB is transferred to the selective gate lines SGD and SGS by transistors 51 and 53. Therefore, the selective transistors ST1 and ST2 are set to an off-state. In addition, in the nonselective groups, the voltage VBB is transferred to the selective gate lines SGD and SGS by the transistors 52 and 54. Therefore, the selective transistors ST1 and ST2 are set to an off-state.

Moreover, VSS is applied to the source line SL, and for example, VBL (0.5 V) is applied to the bit lines BL.

In this manner, the voltage VCGRV is applied to the control gate of the selective memory cells, and its current path is electrically connected to the bit lines BL and the source line SL. If the selective memory cells are in an on-state, current flows from the bit lines BL to the source line SL. A readout operation is carried out by detecting this current through the sense amplifiers 13.

1.3 Arrangement of Memory Cell Arrays and Peripheral Circuits

Next, the arrangement of the memory cell arrays 10 and peripheral circuits in the NAND-type flash memory 1 with the constitution mentioned above will be explained. In the following, circuits other than the memory cell array 10 are sometimes called peripheral circuits.

1.3.1 Arrangement of Peripheral Circuits in a Chip

Figure 10:
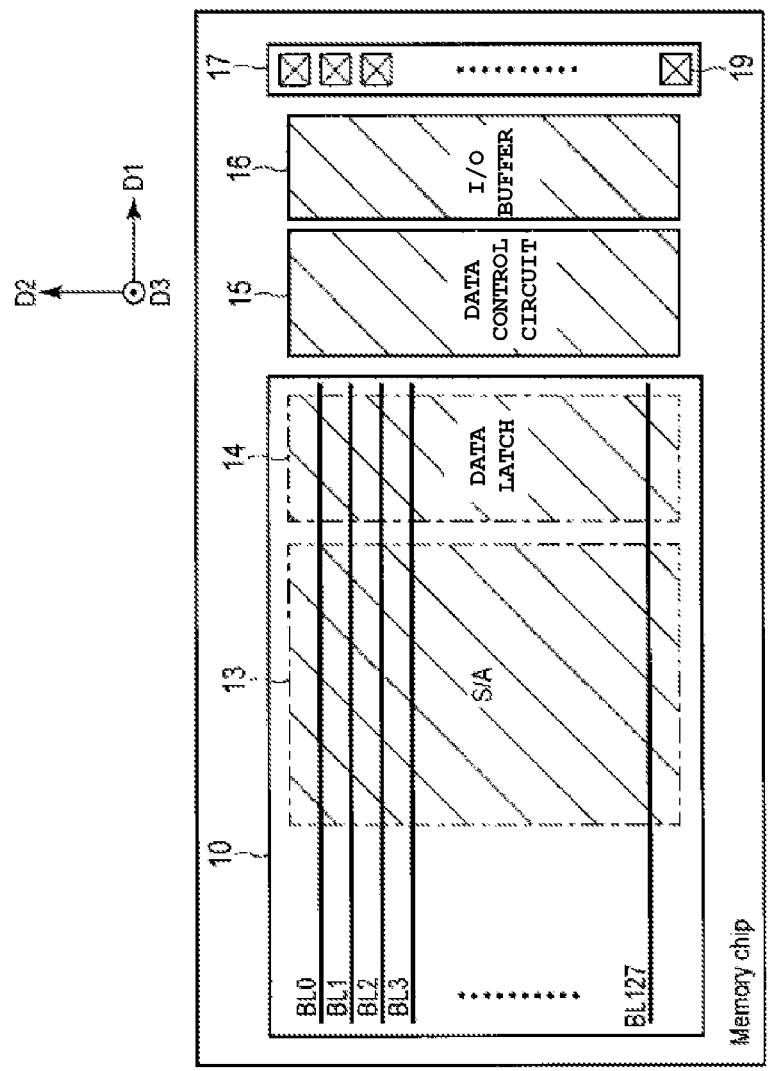
FIG. 10 is a planar layout of the semiconductor storage device according to the first embodiment.

FIG. 10 is a planar layout diagram showing a semiconductor chip in which the NAND-type flash memory 1 of this embodiment is formed.

As shown in the drawing, the sense amplifier 13 and the data latch 14 are formed under the memory cell array 10 and arranged in the first direction D1 along the bit lines BL. In addition, the data control circuit 15, input and output buffer 16, and input and output pad group 17 are arranged in the first direction D1. Moreover, the input and output pads 19 are collected at one side of the semiconductor chip and arranged along one side (the second direction D2) of the semiconductor chip.

1.3.2 Connection of Memory Cell Array and Sense Amplifiers

Figure 11:
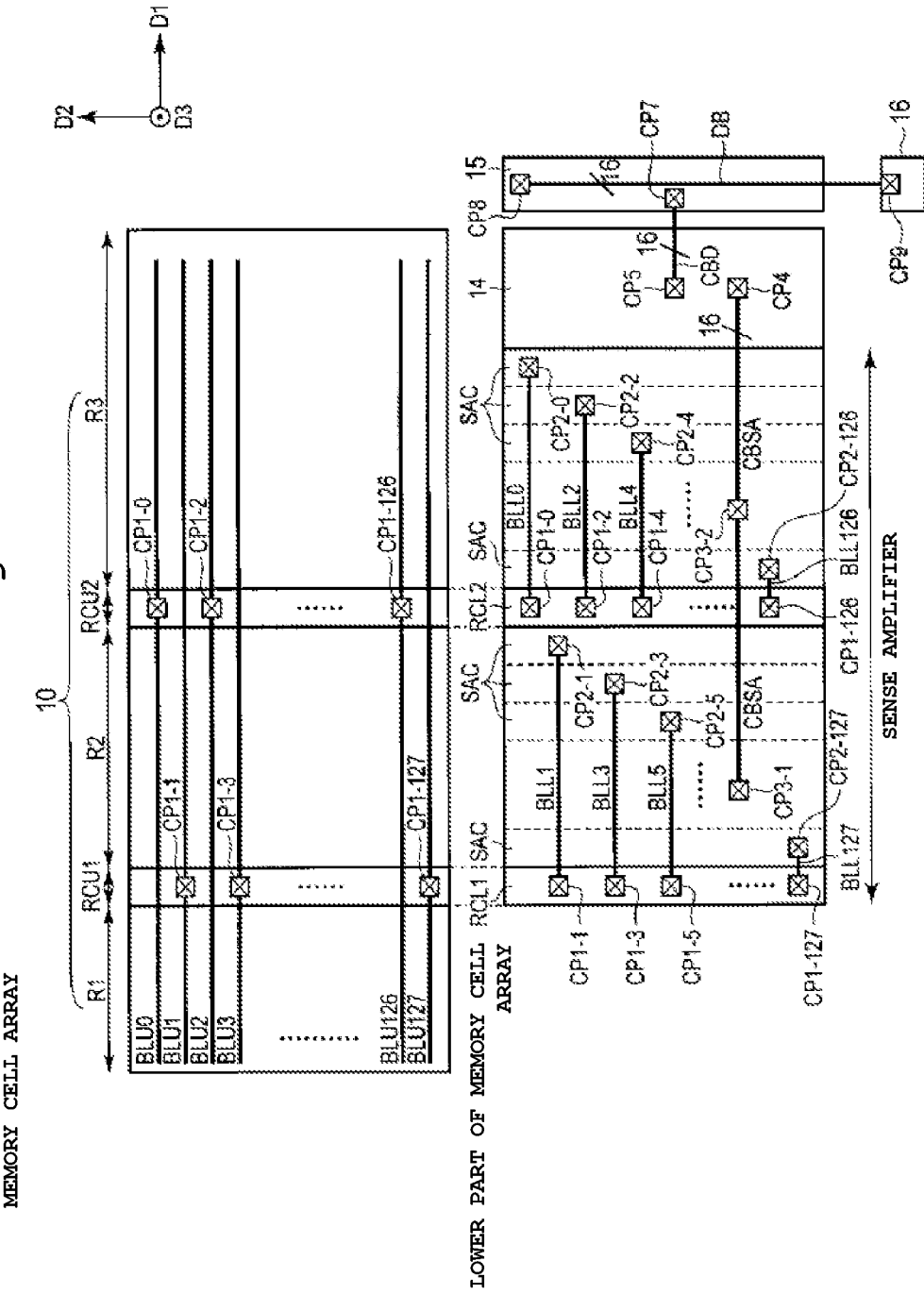
FIG. 11 is a plan view showing the position relation between the memory cell array and peripheral circuits according to the first embodiment.
Figure 12:
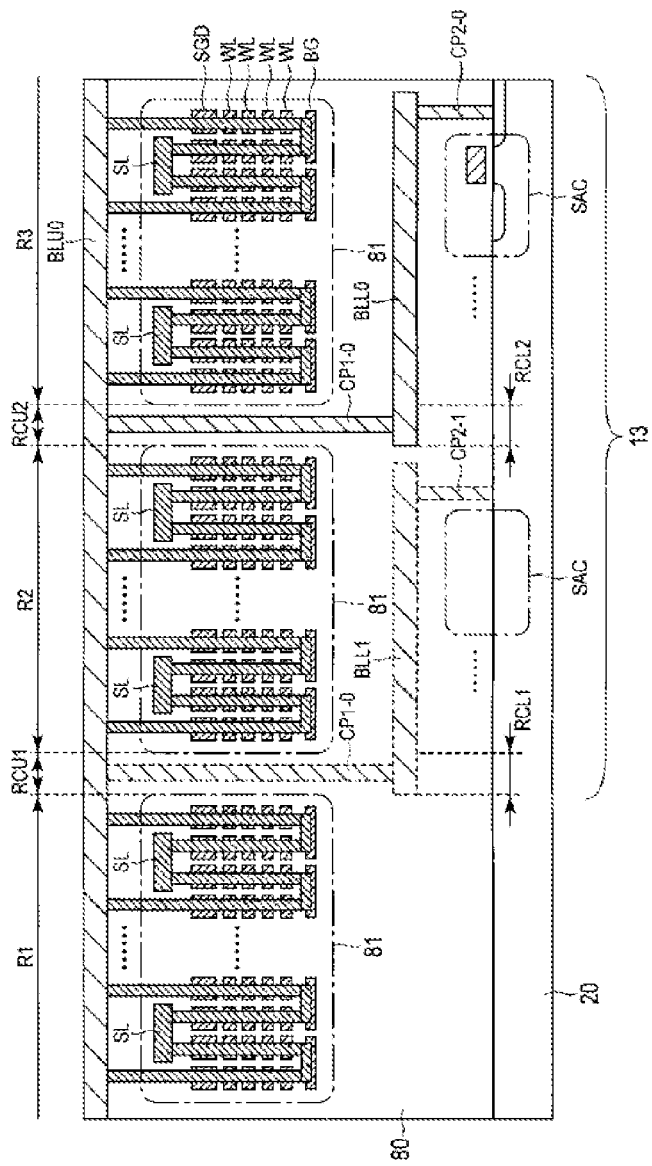
FIG. 12 is a cross section showing the memory cell array and the peripheral circuits according to the first embodiment.

Next, the connection of the memory cell array and the peripheral circuits such as sense amplifiers will be explained. FIG. 11 is a plan view showing the connection relation between the memory cell array 10 and the sense amplifier 13 and the data latch 14 installed in the lower part of the memory cell array. In FIG. 11, the upper figure is a plan view of the memory cell array 10, depicting locations where bit lines are formed. In addition, the lower figure shows the layout of the sense amplifier 13 and the data latch 14 arranged in the lower part of the memory cell array 10, the control circuit 15, and the input and output buffer 16. FIG. 12 is a cross section along the first direction D1 of FIG. 11, especially showing a sectional constitution of the part in which the bit line BL0 is seen.

As shown in the FIG. 11, 128 pieces of upper bit lines BLU (BLU0-BLU127) are formed in the first direction D1. In addition, connecting parts RCU (RCU1, RCU2) of the sense amplifier 13 are installed in the memory cell array 10. In the connecting parts RCU, several contact plugs CP1 arranged in the second direction D2 are formed, and no memory cell is formed.

The connecting parts RCU1 and RCU 2 are arranged with a mutual separation in the first direction. Therefore, it can be said that the memory cell array 10 is divided into first to third regions R1-R3 respectively including a set 81 of memory cells by these connecting parts RCU1 and RCU2.

The upper bit lines BLU pass above these connecting parts RCU. The even upper bit lines BLU0, BLU2, BLU4, . . . are respectively connected to the contact plugs CP1-0, CP1-2, and CP1-4 in the connecting RCU2. On the other hand, the odd upper bit lines BLU1, BLU3, BLU5, . . . are respectively connected to the contact plugs CP1-1, CP1-3, CP1-5, . . . in the connecting part RCU1.

As shown in FIGS. 11 and 12, the contact plugs CP1 connect to the sense amplifier 13 installed in the lower part of the memory cell array. The sense amplifier 13 is provided with a sense amplifier circuit SAC and connecting parts RCL1 and RCL2 installed in the first direction.

The sense amplifier circuit SAC is installed for each upper bit line BLU on the semiconductor substrate 20 and has the constitution explained in FIG. 7. In addition, several sense amplifier circuits SAC are arranged in the first direction.

The connecting parts RCL1 and RCL2 are respectively regions, which are made to correspond to the connecting parts RCU1 and RCU2, where the corresponding contact plugs CP1 are formed. In other words, the contact plugs CP1-1, CP1-3, CP1-5, . . . are installed in the connecting part RCL1, and the contact plugs CP1-0, CP1-2, CP1-4, . . . are installed in the connecting part RCL2.

In the lower part of the memory cell array 10 and above the sense amplifier 13, 128 pieces of lower bit lines BLL (BLL0-BLL127) are formed extending in the first direction D1. The lower bit line BLL connects the contact plugs CP1 and their corresponding sense amplifier circuits SAC. In other words, the upper bit lines BLU, the low bit lines BLL, and the contact plugs CP1 correspond to the bit lines BL explained up to now.

In the sense amplifier 13, the sense amplifier circuits SAC corresponding to the odd bit lines BL1, BL3, BL5, . . . are sequentially arranged between the connecting parts RCL1 and RCL2, and the sense amplifier circuit SAC corresponding to the even bit line BL0, BL2, BL4, . . . are sequentially arranged in the opposite region via the connecting part RCL2. In addition, each sense amplifier circuit SAC and its corresponding contact plugs CP1 are electrically connected by the lower bit line BLL and the contact plug CP2.

The connection relation between the memory cell array 10 and the sense amplifier 13 can also be explained as follows. In other words, the bit line BL includes the upper bit line BLU on the memory cell array 10, the lower bit line BLL in the lower part of the memory cell array 10, and the contact plugs CP1 for connecting both of them.

In the memory cell array 10, several connecting parts (the first connecting part RCU1 and the second connecting part RCU2) for forming the contact plugs CP1 are installed, and the first connecting part RCL1 and the second connecting part RCL2 are installed in accordance with them in the sense amplifier 13.

The upper bit line BLU includes a first upper bit line BLUa and a second upper bit line BLUb. The lower bit line BLL includes a first lower bit line BLLa and a second lower bit line BLLb.

In addition, the first upper bit line BLUa is connected to the first lower bit line BLLa in the first connecting part RCU1, and the second upper bit line BLUb is connected to the second lower bit line BLLb in the second connecting part RCU2.

The sense amplifier circuits SAC are arranged in the first direction. In addition, the sense amplifier circuit SAC, which is connected to the first lower bit line BLLa, is installed in the region (the first sense amplifier region) between the first connecting part RCL1 and the second connecting part RCL2. On the other hand, the sense amplifier circuit SAC, which is connected to the second lower bit line BLLb, is not installed between the first connecting part RCL1 and the second connecting part RCL2 but is installed in the region (the region between the RLC2 and the data latch 14 in FIG. 11; the second sense amplifier region) opposite to the first connecting part RCL1 via the second connecting part RCL2.

Therefore, the first lower bit line BLLa is formed only in the first sense amplifier region, and its length is about the width in the first direction of the first sense amplifier region, even at its maximum length. Similarly, the second lower bit line BLLb is formed only in the second sense amplifier region, and its length is about the width in the first direction of the second sense amplifier region, even at its maximum length. In addition, the number of lower bit lines BLL, which are included in the first and second sense amplifier regions, is a half of the total number of upper bit lines BLU.

Moreover, the first upper bit lines BLUa are adjacent via the second upper bit lines BLUb. As for the second upper bit lines BLUb, similarly, the second upper bit lines BLUb are adjacent via the first upper bit lines BLUa. The lower bit lines BLL are also similarly adjacent. Therefore, the adjacent space between the first lower bit lines BLLa in the first sense amplifier region and the adjacent space between the second lower bit lines BLLb in the second sense amplifier region are twice of the adjacent space of the upper bit lines BLU.

The above explanation is continued with reference to FIGS. 11 and 12. The sense amplifier circuit SAC is further connected to the 16-bit common bus CBSA via the contact plugs CP3 (CP3-1, CP3-2) and further connected to the data latch 14 via the contact plug CP4. The number of sense amplifier circuits SAC is 128 pieces, and the bus width of the common bus CBSA is 16 bits. Therefore, data are transferred to the data latch 14 via the common bus CBSA from 16 pieces of sense amplifier circuits SAC selected by the data control circuit 15. With this transfer operation of 8 times, the data in all the sense amplifier circuits SAC are transferred to the data latch 14.

In addition, the data in the data latch 14 are connected to the data control circuit 15 via the contact plug CP5, a 16-byte common bus CBD, and the contact plug CP7 and further connected to the input and output buffer 16 by a 16-bit data bus.

Figure 13:
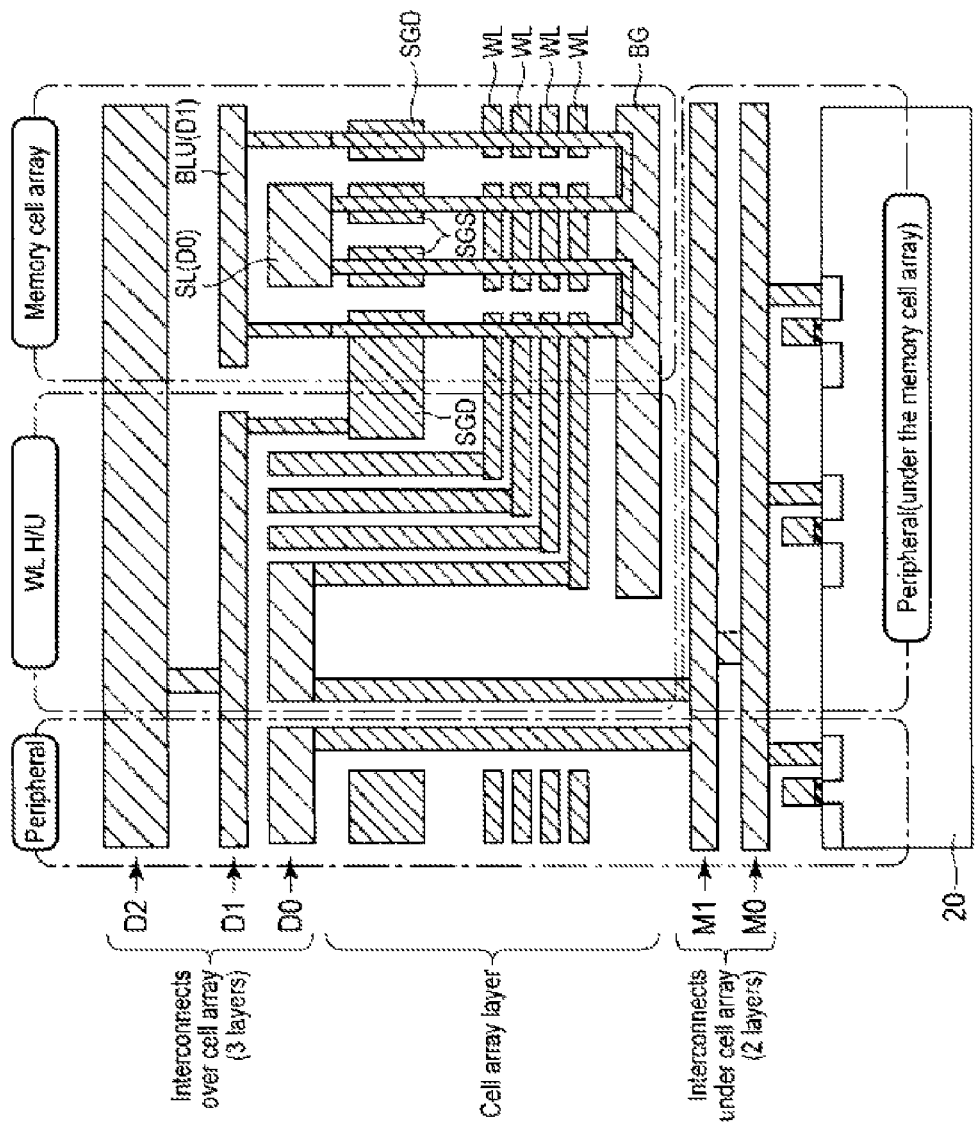
FIG. 13 is a cross section showing the memory cell array and the peripheral circuits according to the first embodiment.

FIG. 13 is a cross section illustrating further details of the sectional structure of the NAND-type flash memory 1, especially showing a region including a word line hookup part. The word line hookup part is installed at the end of the memory cell array 10 and is a region where the word lines WL and the selective gate lines SGD and SGS are connected to the peripheral circuits (row decoders 11).

As shown in the drawing, a metal wiring layer passing above the peripheral circuits installed in the lower part of the memory cell array 10 is installed in two layers (M0, M1). The lower bit lines BLL explained in FIGS. 11 and 12 are formed of any of the metal wiring layers M0 and M1.

In addition, the metal wiring layer passing through the upper part of the memory cell array 10 is installed over three layers (D0-D2). The source line SL is formed of the metal wiring layer D0 of the first layer, and the upper bit line BLU is formed of the metal wiring layer D1 of the second layer. Moreover, the word line WL and the selective gate lines SGD and SGS are connected to the row decoder 11 via at least any of the metal wiring layers D0-D2 of the first layer to the third layer.

1.4 Effects of this Embodiment

As mentioned above, the constitution of this embodiment can improve the operation speed of the NAND-type flash memory 1. This effect will be explained below in detail.

In the conventional NAND-type flash memories in which memory cells are two-dimensionally arranged on a semi-conductor substrate, an architecture in which sense amplifiers, data latch, and their control circuit and transfer system are divided into a half, and each of them are arranged at both sides of a memory cell array has often been employed (hereinafter, this architecture is referred to as a "both-side sense amplifier system"). However, according to the both-side sense amplifier system, a data bus had to be connected to input and output pads from two separate positions, so that the data bus is lengthened, thereby causing difficulty in a high-speed operation.

Accordingly, in the recent NAND-type flash memories, sense amplifiers, data latch, and their control circuit and transfer system have been mainly arranged at one side of a memory cell array (hereinafter, referred to as an "one-side sense amplifier system"). One of the reasons for this is that as a high-speed operation of data is in demand, when these data latch and transfer system are collected as one unit at one side of the array and arranged at the side near a pad column, the length of the data bus line is shortened, so that the design in which skew, etc., are considered is easy, thereby easily realizing a high-speed data transfer. In addition, with the collective arrangement of the circuits, wirings and driving circuits can be reduced, compared with the both-side sense amplifier system, thus being able to reduce the chip area.

Therefore, the one-side sense amplifier system is generally superior to the both-side sense amplifier system. Accordingly, even in the NAND-type flash memory in which memory cells are three-dimensionally laminated on a semiconductor substrate (hereinafter, referred to a three-dimensional laminated NAND-type flash memory), sense amplifier and a data latch system are arranged in the lower part of a memory cell array, and the one-side sense amplifier system is preferably applied.

Figure 14:
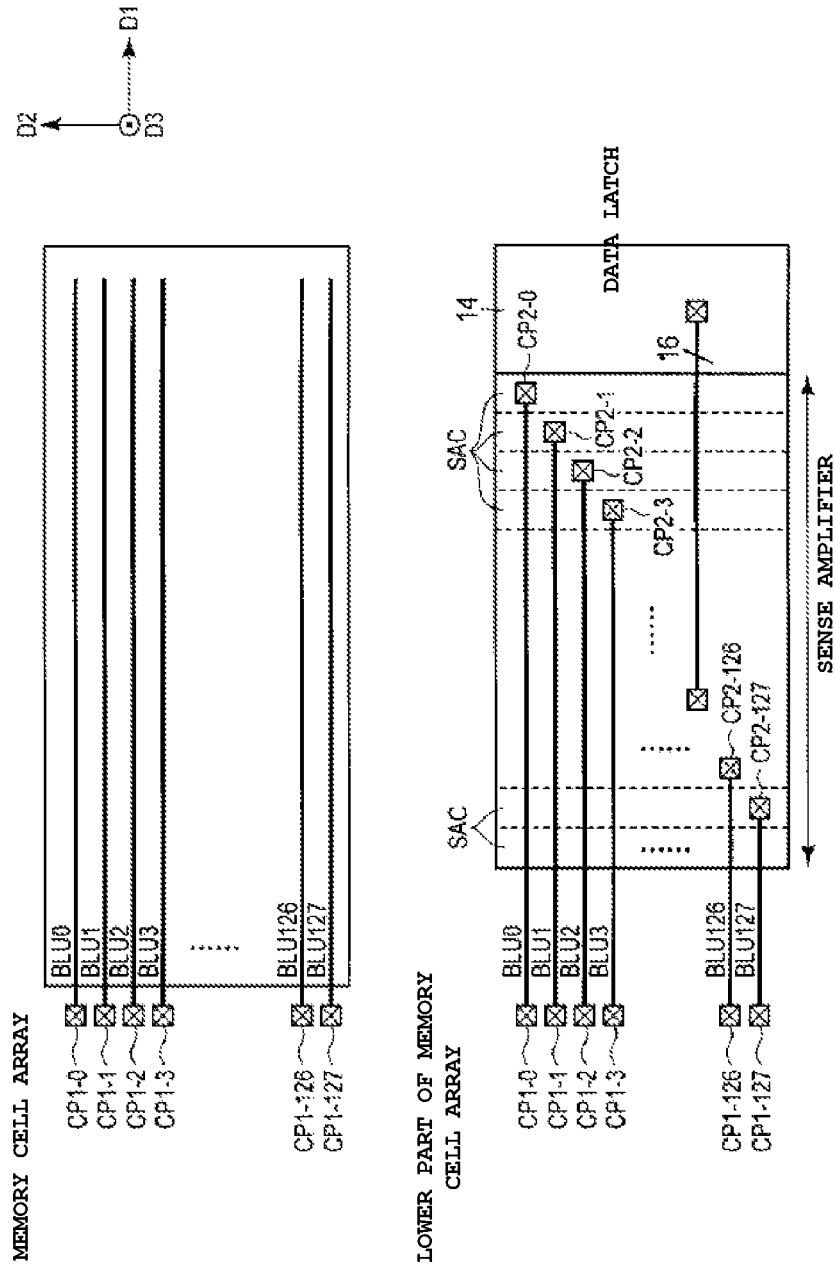
FIG. 14 is a plan view showing the position relation between the memory cell array and the peripheral circuits.

FIG. 14 is a plan view showing a memory cell array and peripheral circuits in the lower part of the memory cell array, when the one-side sense amplifier system is applied to the three-dimensional laminated NAND-type flash memory. FIG. 14 corresponds to FIG. 11 explained in the embodiment, and the same reference symbols are given to the same constituent elements as those of the embodiment.

As shown in the drawing, the upper bit lines BLU on the memory cell array 10 are connected to the lower bit lines BLL in the lower part of the memory cell array 10 in a contact part at the outside of the memory cell array 10 and connected to the sense amplifier circuits SAC, and in the sense amplifier circuits SAC, the upper bit lines are connected to the sense amplifier parts 71 via transistors of the bit line hookup part. As mentioned above, the sense amplifier circuits SAC are installed for each bit line. Therefore, if the number of bit lines BL is 128 pieces, 128 pieces of sense amplifier circuits SAC are also installed.

In this constitution, there is a possibility that the following problems are generated. First, the lower bit lines BLL are lengthened. This is due to the collective arrangement of the sense amplifiers at one side. In other words, the lower bit line BLL0 for connecting the farthest sense amplifier circuit SAC from the contact plugs CP1 has at least a length passing above all the sense amplifier circuits SAC. This length is about twice of the both-side sense amplifier system. Therefore, signal delay occurs in the bit lines BL, leading to the degradation of the readout time or program time. In addition, the wiring length is significantly different for the lower bit lines BLL0 and BLL127. Therefore, the design of operation timing, etc., is difficult.

Secondly, wiring congestion in the lower part of the memory cell array becomes a distinct problem. As shown in FIG. 14, all the upper bit lines BLU are connected to the lower bit lines BLL in the contact part. Therefore, in this region, the bit lines BLL must be formed by an on-pitch design rule (minimum working dimension) similarly to the BLU. Therefore, other wirings are difficult to pass through this region. This phenomenon also occurs similarly in the sense amplifier circuits SAC near the contact part. In other words, the control signal lines or buses of the sense amplifiers cannot be formed in the first direction by using the same wiring layer as that of the lower bit lines BLL, and the number of wiring layer in the lower part of the memory cell array is required to be increased. As a result, the manufacture cost is raised.

According to the constitution of this embodiment, the aforementioned problems can be solved. In other words, in this embodiment, the memory cell array 10 is divided into several regions R1-R3 to distribute lead-in openings under the memory cell array 10 of the bit lines BL. As a result, the wiring congestion of the lower part of the memory cell array 10 can be relaxed, thus being able to realize the one-side sense amplifier system.

More specifically, the wirings are most congested in connecting openings of the bit lines BL and the sense amplifiers 13. Therefore, the connecting openings are distributed and arranged in several groups under the memory cell array 10. In other words, first, connecting parts of the first bit line group (odd bit lines BL1, Bl3, . . . ) and the first sense amplifier group (sense amplifier circuits SAC corresponding to the odd bit lines), which are led in the lower part of the memory cell array 10, are installed in the first memory cell array divided parts RCU1 and RCL1. In the divided parts RCU1 and RCL1, the number of bit lines BL, which are led in the lower part of the memory cell array 10, is 64 pieces (a half of 128 pieces in total). Therefore, the wiring congestion in this region is a half of the case of FIG. 14. In addition, the first bit line group is connected to the sense amplifier circuits SAC in the lower part of the memory cell array, so that the number of lower bit lines BLL in the first direction is reduced, thereby further relaxing the wiring congestion.

Next, the second memory cell array divided parts RCU2 and RCL2 are installed in the part to which the lower bit line BLL1 is connected in the farthest sense amplifier circuit SAC. In addition, connecting parts of the second line group (even bit lines BL0, BL2, . . . ) and the second sense amplifier group (sense amplifier circuits SAC corresponding to the even bit lines), which are led in the lower part of the memory cell array via the divided parts RCU2 and RCL2, are installed.

In this manner, the memory cell array 10 is divided into several regions R1-R3, and the respective bit lines BL divided into groups and the sense amplifiers 13 are connected in the lower part of the divided regions R2 and R3. Therefore, the wiring length of the lower bit lines BLL is shortened, enabling a high-speed operation. In addition, the wiring congestion in the lower part of the memory cell array 10 is relaxed, and the number of wiring layer can be reduced, thus being able to cut down the manufacture cost.

2. Embodiment 2

Next, the semiconductor storage device of a second embodiment will be explained. This embodiment provides several examples of the connecting parts RCU and RCL. In the following, only the differences from the first embodiment will be explained.

2.1 First Example

Figure 15:
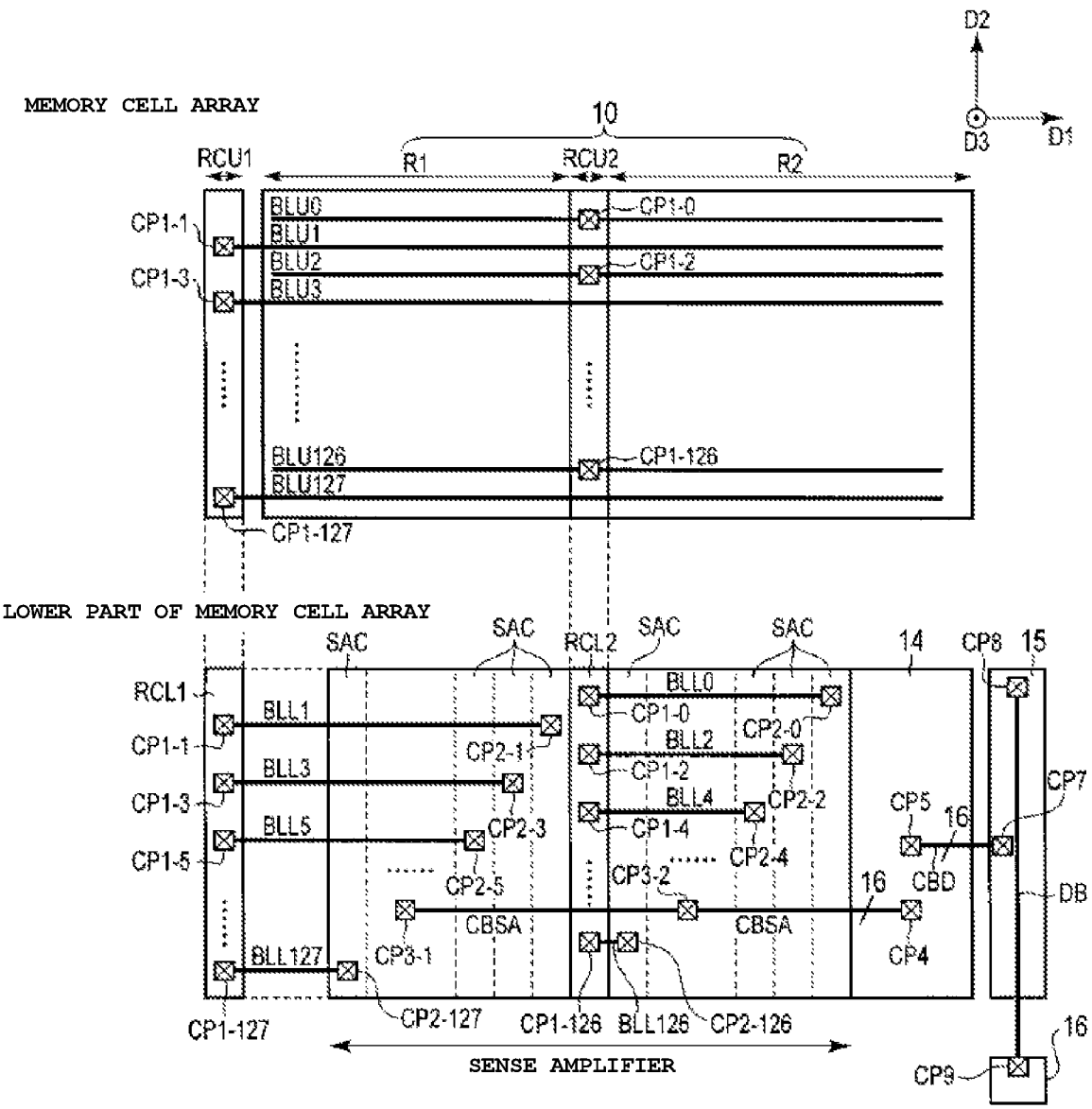
FIG. 15 is a plan view showing the position relation between a memory cell array and peripheral circuits according to a second embodiment.

First, a first example will be explained with reference to FIG. 15. FIG. 15 is a plan view illustrating the connection relation between the memory cell array 10 and the sense amplifiers 13 and the data latch 14 installed in its lower part, showing the same region as that of FIG. 11 explained in the first embodiment.

As shown in the drawing, in this example, the connecting part RCU1 is installed at the outside of the memory cell array 10 in the constitution of FIG. 11 explained in the first embodiment. At the same time, the connecting part RCL1 is also installed at the outside of the sense amplifier 13. In this case, an effect similar to that of the first embodiment can be obtained.

2.2 Second Example

Figure 16:
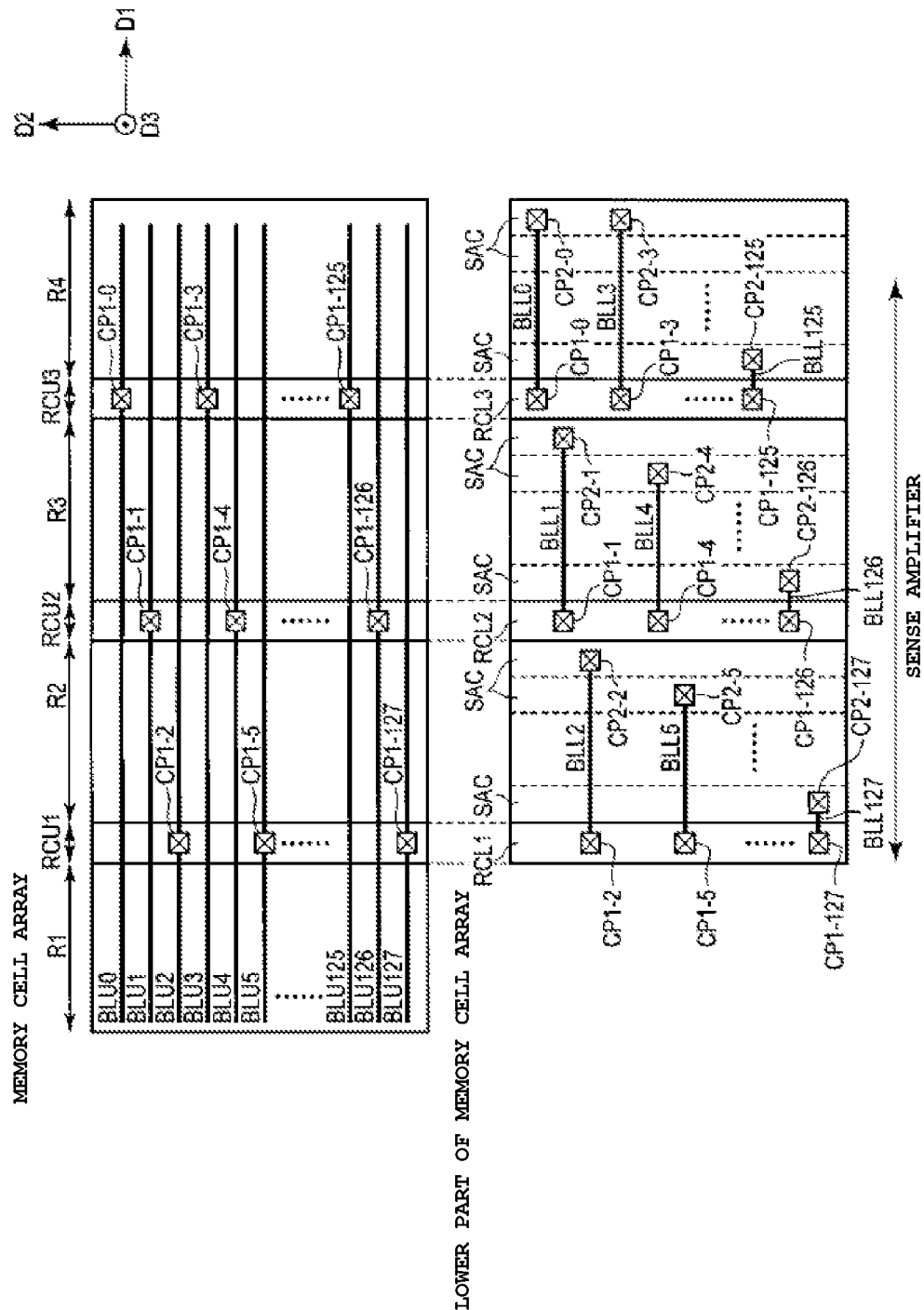
FIG. 16 is a plan view showing the position relation between the memory cell array and the peripheral circuits according to the second embodiment.

Next, a second example will be explained with reference FIG. 16. FIG. 16 is a plan view illustrating the connection relation between the memory cell array 10 and the sense amplifier 13 and the data latch 14 installed in the lower part of the memory cell array, showing the same region as that of FIG. 11 explained in the first embodiment.

As shown in the drawing, in this example, the number of connecting parts RCU and RCL is 3 in the constitution of FIG. 11 explained in the first embodiment. Therefore, the memory cell array 10 is divided into four regions. In this case, an effect similar to that of the first embodiment can also be obtained. In addition, the average of the length of the lower bit lines BLL is shorter than that of the first embodiment. Therefore, a higher-speed operation is possible.

The number of connecting parts RCU and RCL may be 4 pieces or more. Moreover, through the combination of the first example and the second example, any of the connecting parts RCU may be installed at the outside of the memory cell array 10 in the constitution of FIG. 16.

2.3 Third Example

Figure 17:
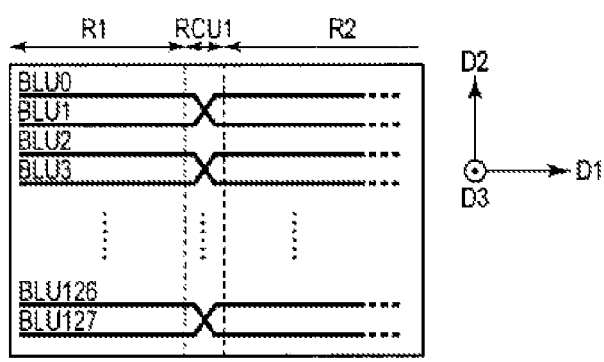
FIG. 17 is a plan view showing the memory cell array according to the second embodiment.

Next, a third example will be explained with reference to FIG. 17. FIG. 17 is a plan view illustrating a partial region of the memory cell array 10, especially showing a planar pattern of the upper bit lines BLU.

As shown in the drawing, the upper bit lines BLU may be formed so that they intersect with the adjacent upper bit lines BLU. In addition, the connecting part RCU may be formed in the intersecting region. For example, in the upper bit lines BLU0 and BLU1, the upper bit line BLU0 is formed of the metal wiring layer D1 of the second layer in the first and second regions R1 and R2. On the contrary, the upper bit line BLU1 is formed of the metal wiring layer in the first and second regions R1 and R2; however, it is connected to the metal wiring layer D3 of the third layer in the connecting RCU and passed above the upper bit line BLU0 by the metal wiring layer D3.

Therefore, with the change of the positions of the adjacent upper bit lines BLU for each region, the capacitance of the upper bit lines BLU can be appropriately designed. In addition, at the positions where the upper bit lines BLU are replaced, it is necessary to forma contact plug for connecting at least one of the upper bit lines BLU to the metal wiring layer of the upper layer. Therefore, if the contact plugs CP1, which are connected to the lower bit lines BLL, is formed in this region, the area increase due to the installation of the connecting part RCU can be suppressed.

3. Embodiment 3

Next, the semiconductor storage device of a third embodiment will be explained. This embodiment relates to a method for connecting bit lines BL and sense amplifiers and provides examples of the connecting method different from those of the first and second embodiments. In the following, only the differences from the first embodiment will be explained.

3.1 First Example

Figure 18:
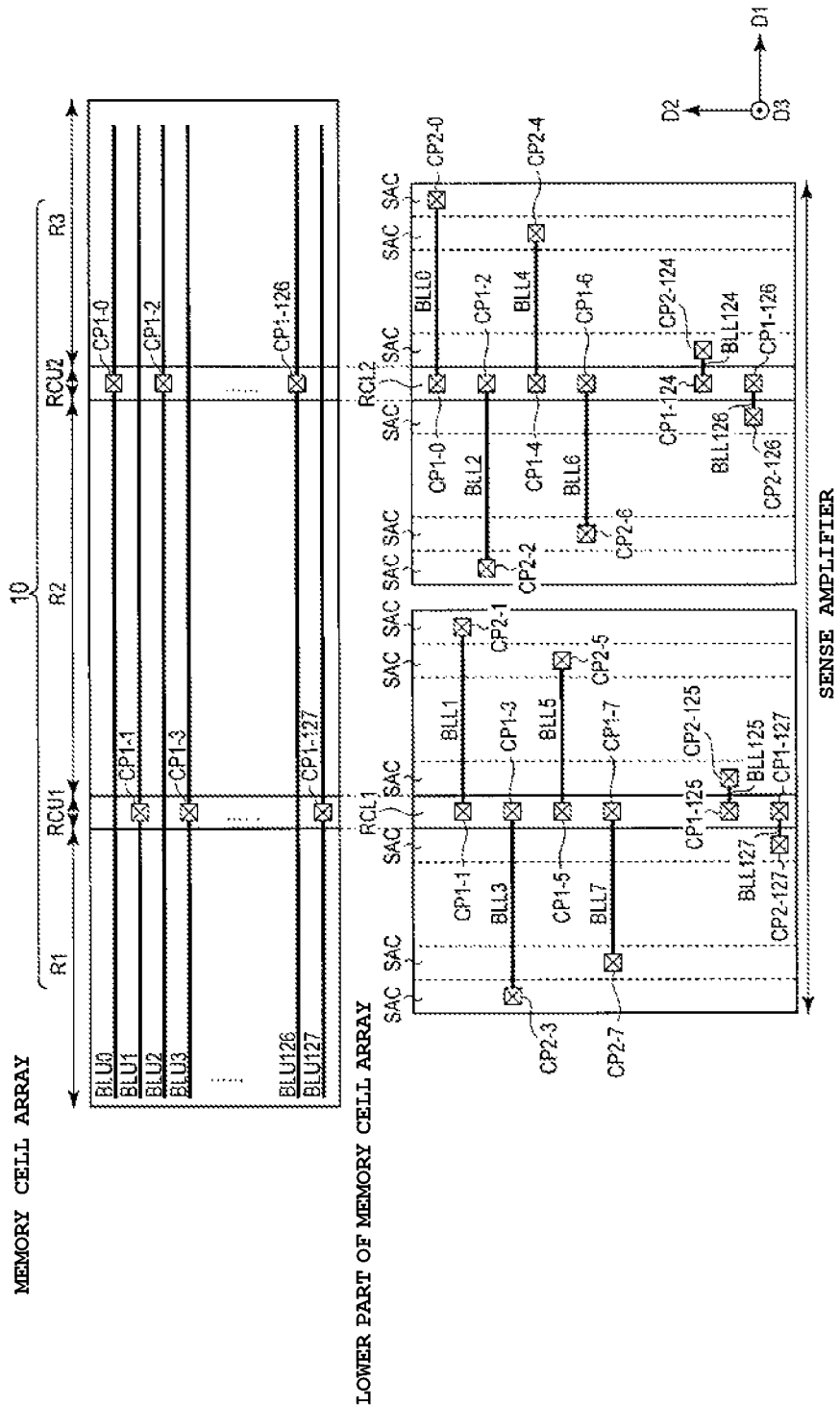
FIG. 18 is a plan view showing the position relation between a memory cell array and peripheral circuits according to a third embodiment.
Figure 19:
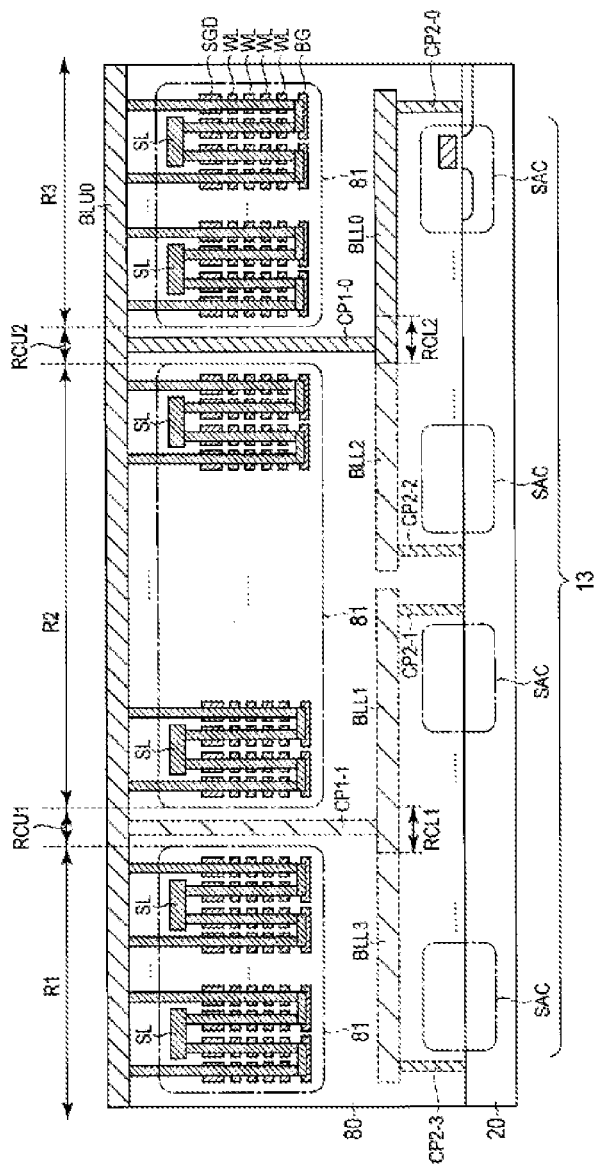
FIG. 19 is a cross section showing the memory cell array and the peripheral circuits according to the third embodiment.

First, a first example will be explained with reference to FIGS. 18 and 19. FIG. 18 is a plan view illustrating the connection relation between the memory cell array 10 and the sense amplifiers 13 installed in the lower part of the memory cell array, showing the same region as that of FIG. 11 explained in the first embodiment. However, for simplicity, a data latch and wirings for connecting the sense amplifier and the data latch are omitted in the drawing. In addition, FIG. 19 is a cross section of FIG. 18, especially showing the region where the lower bit line BLL0 is seen.

As shown in the drawings, in this example, in the constitution of FIG. 11 explained in the first embodiment, the lower bit lines BLL, which are connected to the upper bit lines BLU by the connecting part RCL, are arranged in the first direction D1 at both sides via the connecting part RCL. More specifically, this constitution is as follows.

As mentioned above, the even lower bit lines BLL0, BLL2, BLL4, . . . are connected to the upper bit lines BLU via the connecting part RCL2. These lower bit lines are sequentially arranged so that they face each other via the connecting part RCL2. In other words, the lower bit lines BLL0, BLL4, BLL8, . . . and the sense amplifier circuits SAC, which are connected to these lower bit lines, are installed below the region R3. On the other hand, the lower bit lines BLL2, BLL6, BLL10, and the sense amplifier circuits SAC, which are connected to these lower bit lines, are installed below the region R2.

The odd lower bit lines BLL1, BLL3, BLL5, . . . are connected to the upper bit lines BLU via the connecting part RCL1. These lower bit lines are sequentially arranged so that they face each other via the connecting part RCL1. In other words, the lower bit lines BLL1, BLL5, BLL9, . . . and the sense amplifier circuits SAC, which are connected to these lower bit lines, are installed below the region R2. On the other hand, the lower bit lines BLL3, BLL7, BLL12, . . . and the sense amplifier circuits SAC, which are connected to these lower bit lines, are installed below the region R1.

Therefore, the lower bit lines BLU may be led out to both sides as well as one side of the connecting part RCL. According to this constitution, the adjacent space of the lower bit lines BLL can be twice of the case shown in FIG. 11, making the wiring layout easy. In addition, the length of each low bit line BLL can be about a half of the case shown in FIG. 11. Therefore, the length of the lower bit lines BLL can be further shortened, enabling a high-speed operation.

Here, in FIGS. 18 and 19, the method for leading out the lower bit lines to both sides is applied to FIG. 11; however, this method can also be applied to the constitution explained in FIGS. 15-17.

3.2 Second Example

Figure 20:
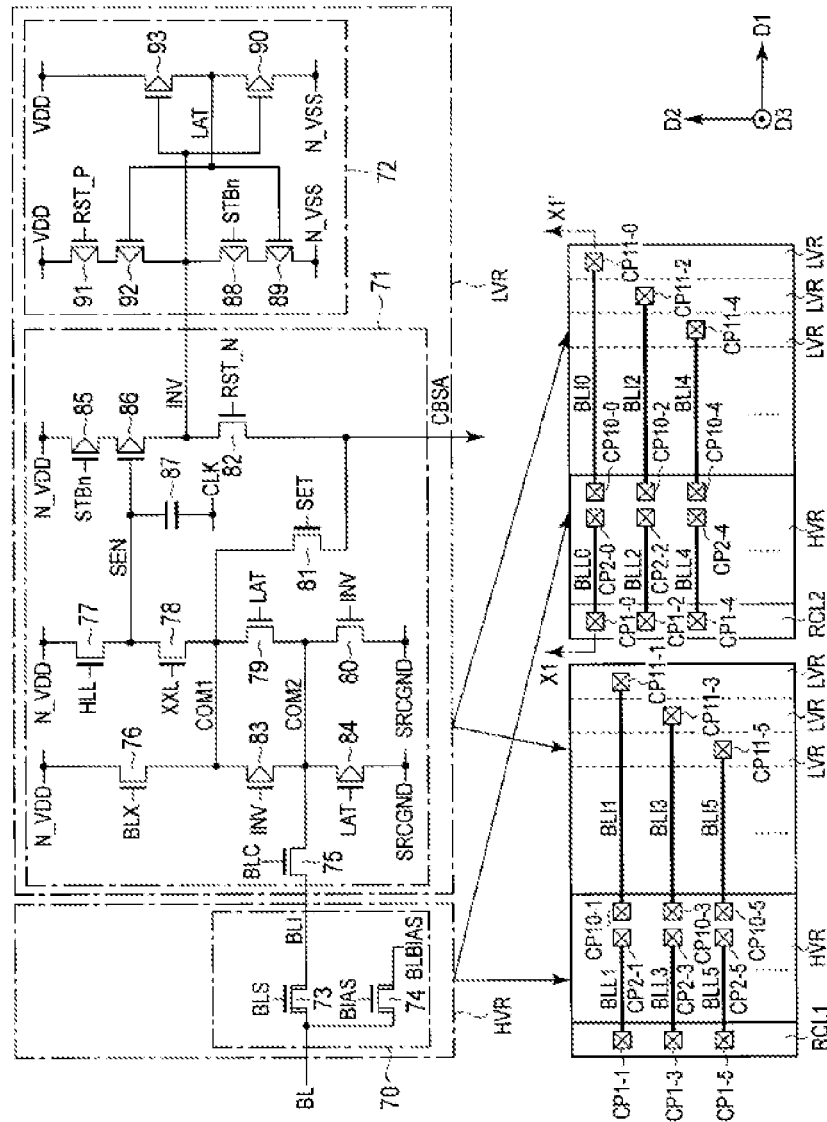
FIG. 20 is a schematic and a plan view showing sense amplifiers according to the third embodiment.

Next, a second example will be explained with reference to FIGS. 20 and 21. FIG. 20 is a schematic and a plan view showing sense amplifiers 13 installed in the lower part of the memory cell array 10. The plan view of FIG. 20 shows the same region as that of FIG. 18. However, in FIG. 20, for simplicity, a data latch and wirings for connecting the sense amplifiers and the data latch are omitted. In addition, FIG. 21 is a cross section along X1-X1' line of FIG. 20.

As shown in FIG. 20, the sense amplifier 13 can be largely divided into two regions of a high-breakdown voltage transistor region HVR and a low-breakdown voltage transistor region LVR. The region HVR is a region where a relatively high voltage is handled, and the hookup part 70 corresponds to this region. The transistor in the region HVR, for example, is a high-breakdown voltage transistor with a thick gate insulating film. On the contrary, the low-breakdown voltage transistor region LVR is a region where a voltage lower than that of the region HVR is handled, and the sense amplifier part 71 and the data holding part 72 correspond to this region. The transistor in the region LVR, for example, is a low-breakdown voltage transistor with a gate insulating film thinner than that of the transistor in the region HVR.

Figure 21:
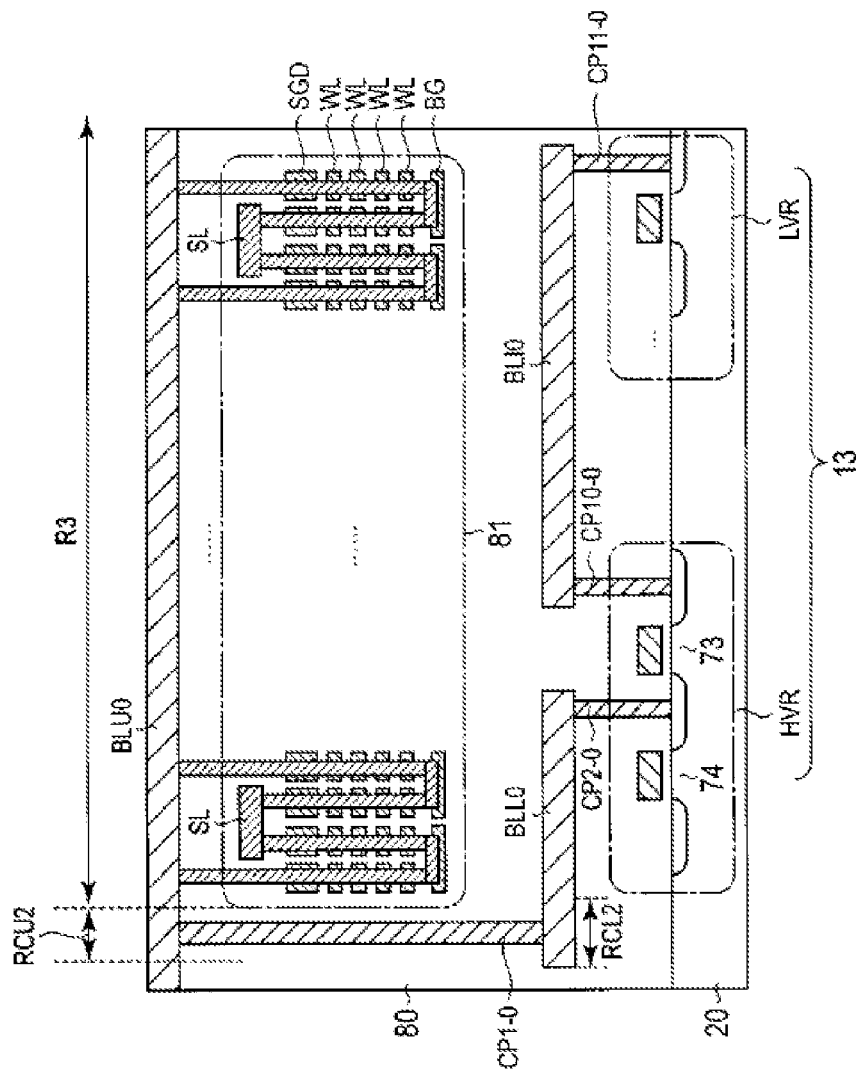
FIG. 21 is a cross section showing the memory cell array and the sense amplifiers according to the third embodiment.

Next, in this example, as shown in FIGS. 20 and 21, the high-breakdown voltage transistor region HVR in each sense amplifier circuit SAC is collectively arranged near the connecting part RCL, and the low-breakdown voltage transistor regions LVR are sequentially arranged at remote positions from the connecting part RCL.

In other words, the contact plugs CP1 in the connecting part RCL are connected to the high-breakdown voltage transistor region HVR by the lower bit lines BLL and the contact plug CP2. More specifically, this contact plug is connected to one end of the current paths of the transistors 73 and 74. Next, the other end of the current paths of the transistors 73 and 74 are connected to the low-breakdown voltage transistor region LVR via the contact plug CP10, the node BLI (metal wiring layer installed at the same height as that of the lower bit lines BLL), and the contact plug CP11. More specifically, these other ends are connected to one end of the current path of the transistor 75.

In the constitution, the length of each low bit line BLL is about the same. On the contrary, the wiring layers BLI have a wiring length different from each other similarly to the lower bit lines BLL of FIG. 11. In other words, the wiring layers BLI0 and BLI1 in which the corresponding region LVR is installed in the farthest place is longest, and the wiring layers BLI126 and BLI127 (not shown in the drawing) in which the corresponding region LVR is installed at the nearest place is shortest.

Here, in FIGS. 20 and 21, the method for dividing the sense amplifiers into the regions HVR and LVR is applied to FIG. 11; however, this method can also be applied to the constitution explained in FIGS. 15-19.

4. Modified Examples

As mentioned above, the semiconductor storage device 1 of the embodiments is provided with the peripheral circuits 13, the memory cell array 10, the upper bit lines BLU, and the first and second connecting parts RCU1 and RCU2. The peripheral circuits 13 are installed on the semiconductor substrate 20. The memory cell array 10 is installed on the peripheral circuits 13 via an interlayer dielectric, and the first region R1 and the second region R2 respectively including several memory cells MT laminated on the interlayer dielectric are arranged in the first direction D1. The upper bit lines BLU are installed in the first direction D1 on the memory cell array 10 and electrically connected with the memory cell MT. The first and second connecting parts RCU1 and RCU2 are respectively provided with the contact plugs CP1 arranged in the second direction D2 orthogonal to the first direction D1, and one of these connecting parts is installed between the first and second regions R1 and R2. The upper bit lines BLU are provided with the first upper bit lines (odd bit lines), which are connected to the peripheral circuits 13 via the contact plugs CP1 of the first connecting part RCU1 and the second upper bit lines (even bit lines) which are connected to the peripheral circuits 13 via the contact plugs CP1 of the second connecting part RCU2.

Figure 22:
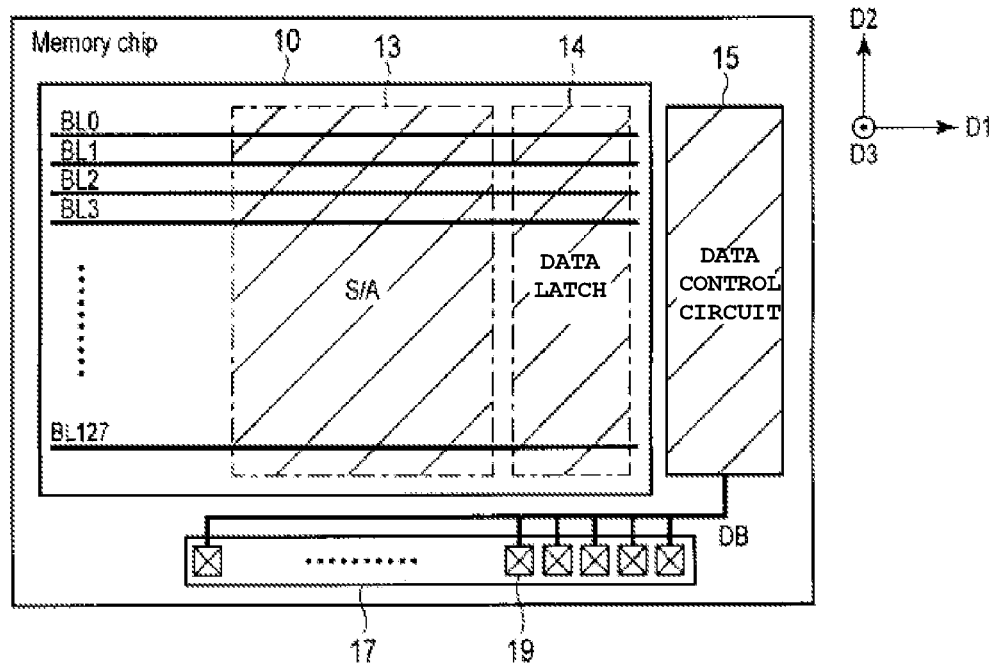
FIG. 22 is a planar layout of the semiconductor storage device of a modified example of the first to third embodiments.

With this constitution, the operation speed of the semiconductor storage device 1 can be improved. However, the present disclosure is not limited to the aforementioned embodiments but can be variously modified. For example, in the embodiment, as explained in FIG. 10, the case where the input and output pads 19 are collectively installed at one side of the chip and arranged in the second direction D2 orthogonal to the bit lines BL has been mentioned as an example. However, as shown in the planar layout of the semiconductor chip of FIG. 22, the input and output pads 19 may also be installed in the first direction D1 parallel with the bit lines BL. However, the constitution of FIG. 11 is generally more desirable because the data bus DB length is shortened.

Figure 23:
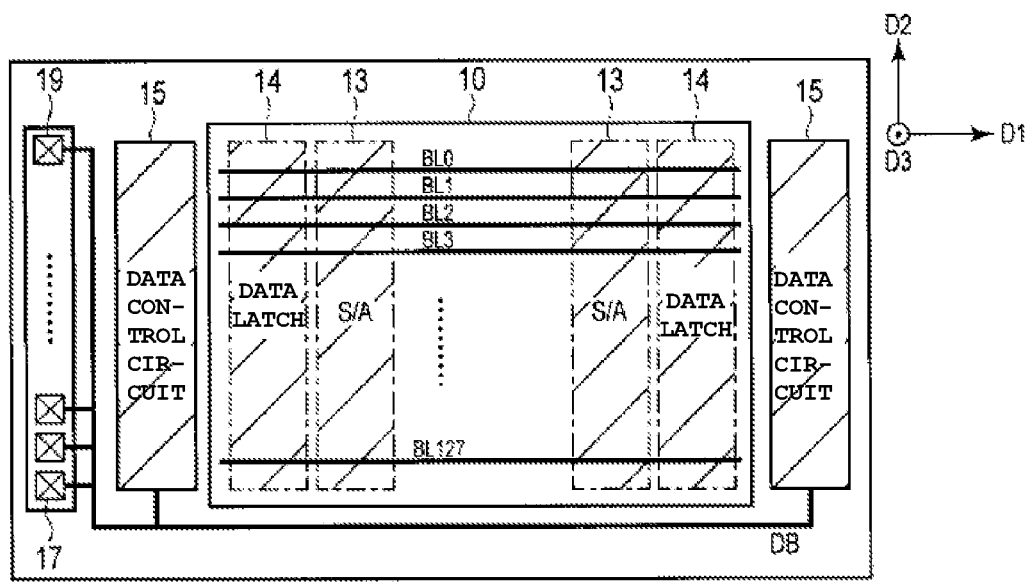
FIG. 23 is a planar layout of the semiconductor storage device of a modified example of the first to third embodiments.
Figure 24:
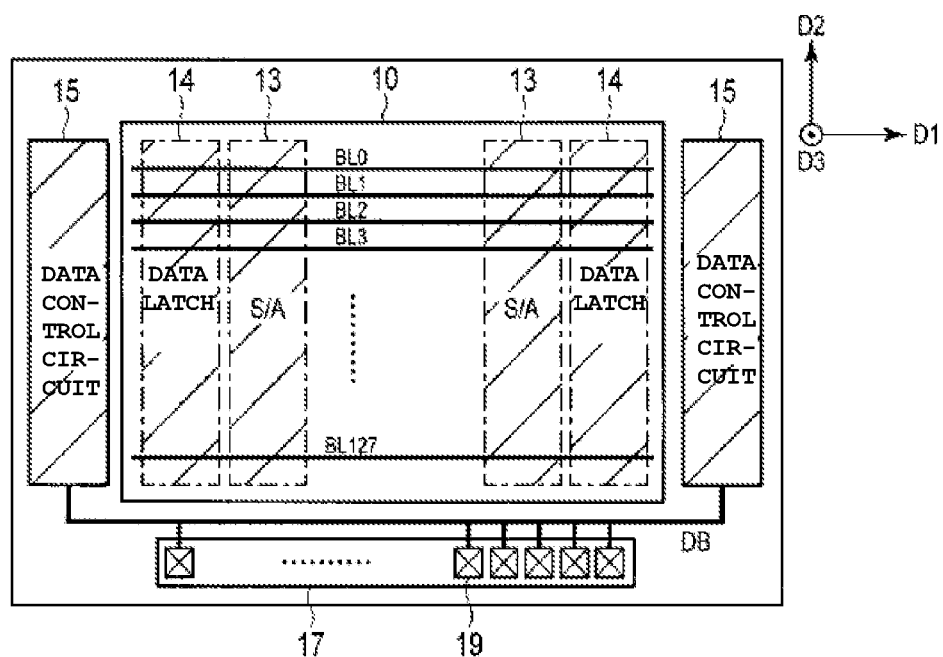
FIG. 24 is a planar layout of the semiconductor storage device of a modified example of the first to third embodiments.

Or the both-side sense amplifier system explained in the first embodiment may also be adopted. A planar layout of this case is shown in FIGS. 23 and 24. As shown in the drawings, the sense amplifiers 13 and the data latches are divided into two and arranged at two positions of the region in the lower part of the memory cell array 10. In this case, the aforementioned embodiments may also be applied.

In addition, the metal wiring layers M0 and M1 of two layers explained in FIG. 13 can be used for various usages. For example, the metal wiring layer M1 of the second layer can be used in the lower bit lines BLL, common bus CBSA, CBD, DB, etc. The metal wiring layer M0 of the first layer, which is formed in the layer lower than the metal wiring layer M1, for example, can be used in power source line, GND line, or global control signals which are broadly used NAND-type flash memory 1.

Figure 25:
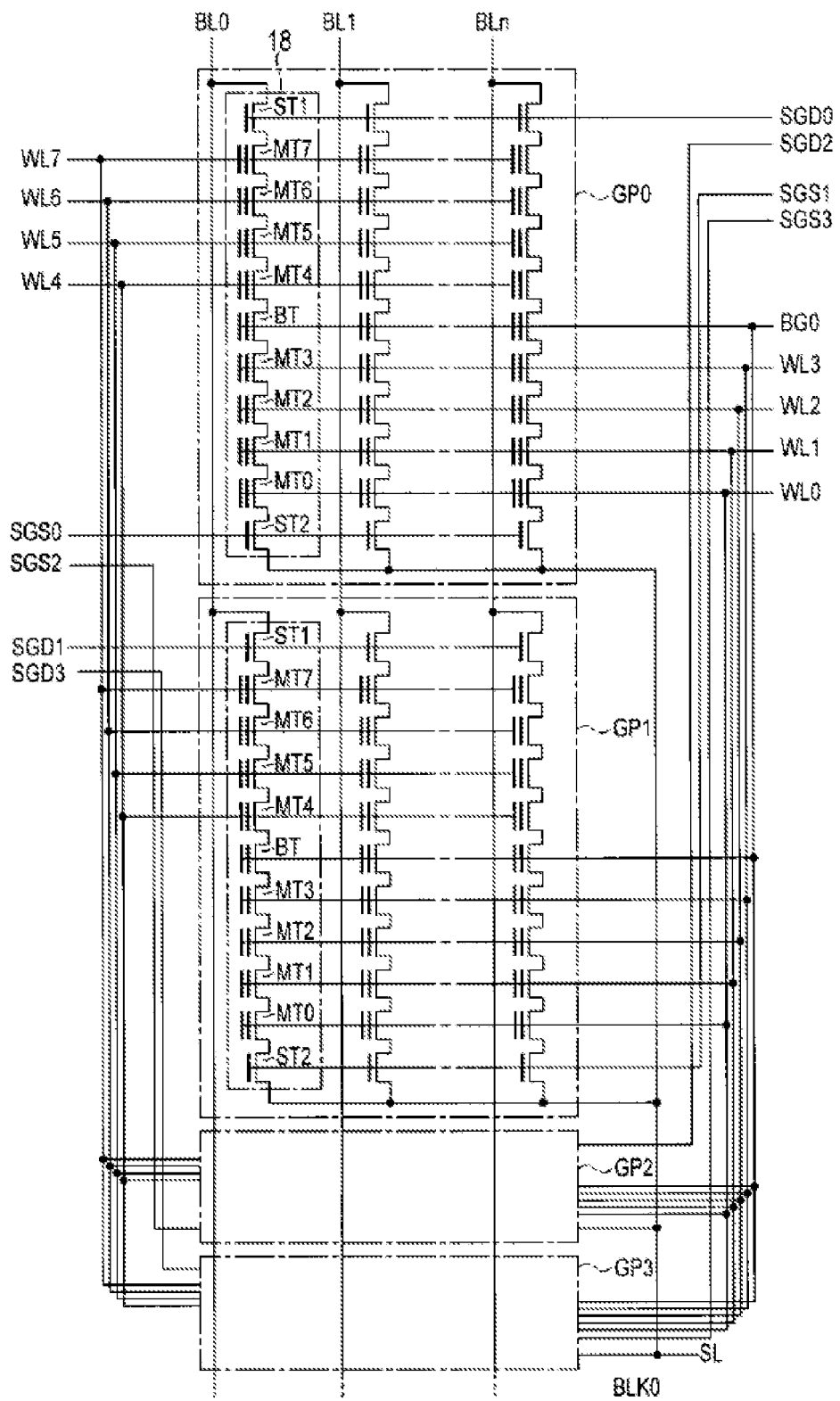
FIG. 25 is a circuit diagram showing a memory cell array of a modified example of the first to third embodiments.

Moreover, the memory cell array shown in FIG. 2 may have a constitution as shown in FIG. 25. FIG. 25 is a circuit diagram showing the block BLK0, and the other blocks BLK1-BLK3 can also have similar constitutions. As shown in the drawing, the word lines WL0-WL3, back gate lines BG, and the even selective gate lines SGD0 and SGD2, and the odd selective gate lines SGS1 and SGS3 are led out to one end of the memory cell array 10. On the contrary, the word lines WL4-WL7, the even select gate lines SGS0 and SGS2, and the odd selective gate lines SGD1 and SGS3 are led out to the other end opposite to the one end. This constitution may also be adopted. In this constitution, for example, the row decoder 11 may be divided into two row decoders and arranged oppositely to each other via the memory cell array 10. In addition, the selective gate lines SGD0, SGD2, SGS1, and SGS3, the word lines WL0-WL3, and the back gate lines BG may be selected by one row decoder, and the selective gate lines SGS0, SGS2, SGD1, and SGD3 and the word lines WL4-WL7 may be selected by the other row decoder. According to this constitution, the congestion of wirings such as selective gate lines and the word lines of the region (including the row decoder 11) between the driver circuit 12 and the memory cell array 10 can be relaxed.

Furthermore, in the aforementioned embodiments, the three-dimensional laminated NAND-type flash memory has been mentioned as an example of the semiconductor storage device. However, the three-dimensional laminated NAND-type flash memory is not limited to the constitutions of FIGS. 3-5. For example, the semiconductor layer 26 may be one columnar shape instead of the U type shape. In this case, the transistors BT are unnecessary. In addition, the aforementioned embodiments are not limited to the NAND-type flash memory but can be applied to general semiconductor devices in which memory cells are three-dimensionally laminated and peripheral circuits are arranged right under the memory cell array. As such a semiconductor device, for example, there is ReRAM (Resistive RAM) in which memory cells are formed of a non-ohmic element and a resistance-variable material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a plurality of word lines, the word lines including:
- a plurality of first word lines extending in a first direction and a second direction, and separated from each other in a third direction, the first, second, and third directions crossing one another;
- a plurality of second word lines extending in the first direction and the second direction, and separated from each other in the third direction;
- a plurality of third word lines extending in the first direction and the second direction, and separated from each other in the third direction; and
- a plurality of fourth word lines extending in the first direction and the second direction, and separated from each other in the third direction, a plurality of sense amplifier circuits;
a plurality of first memory strings intersecting the first word lines, and extending in the third direction;
a plurality of second memory strings intersecting the second word lines, and extending in the third direction;
a plurality of third first memory strings intersecting the third word lines, and extending in the third direction;
a plurality of fourth first memory strings intersecting the fourth word lines, and extending in the third direction;
a first region between the first word lines and the second word lines in the first direction;
a second region between the second word lines and the third word lines in the first direction;
a third region between the third word lines and the fourth word lines in the first direction;
a plurality of first bit lines extending in the first direction and separated from each other in the second direction, each of the first bit lines being connected to a corresponding one of the first memory strings, a corresponding one of the second memory strings, a corresponding one of the third memory strings, and a corresponding one of the fourth memory strings;
a plurality of second bit lines between the plurality of word lines and the sense amplifier circuits in the third direction, each of which is aligned with a corresponding one of the first bit lines along the third direction and connected to a corresponding one of the sense amplifier circuits; and
a plurality of contact plugs extending in the third direction, respectively connected to the first bit lines and the second bit lines, and arranged such that one of the contact plugs is shifted in the first direction and in the second direction with each of the contact plugs that neighbor said one of the contact plugs in the first direction.

2. The semiconductor storage device of claim 1, wherein the contact plugs include
- a plurality of first contact plugs in the first region, which electrically connect first bit lines of a first group of the plurality of first bit lines with second bit lines of a corresponding first group of the plurality of second bit lines, respectively,
- a plurality of second contact plugs in the second region, which electrically connect first bit lines of a second group of the plurality of first bit lines with second bit lines of a corresponding second group of the plurality of second bit lines, respectively,
- a plurality of third contact plugs in the third region, which electrically connect first bit lines of a third group of the plurality of first bit lines with second bit lines of a corresponding third group of the plurality of second bit lines, respectively, and the first region, the second region, and the third region are separated in the first direction.

3. The semiconductor storage device of claim 2, wherein
the first contact plugs are aligned along the second direction,
the second contact plugs are aligned along the second direction, and
the third contact plugs are aligned along the second direction.

4. The semiconductor storage device of claim 3, wherein the first bit lines extend in the first direction to pass over the first word lines, the first region, the second word lines, the second region, the third word lines, the third region and the fourth word lines, in this order.

5. The semiconductor storage device of claim 1, wherein
the contact plugs are provided in each of N regions including the first region and the second region, where N is an integer greater than 1, and the first to N-th regions are arranged along the first direction, and
the word lines includes M word lines including the first word lines, the second word lines, and the third word lines, provided correspondingly with M array regions, respectively, where M is an integer greater than N, and the first to M-th word lines are arranged along the first direction.

6. The semiconductor storage device of claim 5, wherein in each of the first to N-th regions, the contact plugs are aligned with each other along the second direction.

7. The semiconductor storage device of claim 1, wherein each of the sense amplifier circuits includes a low voltage circuit and a high voltage circuit, and
the second bit lines are connected to the high voltage circuits of the sense amplifier circuits, respectively.

8. The semiconductor storage device of claim 1, further comprising:
a plurality of data latches, each provided on a semiconductor substrate and under the plurality of word lines and connected to the sense amplifier circuits.

9. The semiconductor storage device of claim 1, further comprising:
a plurality of circuit-side contact plugs, a first group of which connects a first group of the second bit lines and a first group of the sense amplifier circuits, and a second group of which connects a second group of the second bit lines and a second group of the sense amplifier circuits.

10. The semiconductor storage device of claim 9, wherein
the circuit-side contact plugs of the first group are not aligned along the second direction, and
the circuit-side contact plugs of the second group are not aligned along the second direction.

11. The semiconductor storage device of claim 1, wherein the plurality of second bit lines are between the second, third, and fourth word lines and the sense amplifier circuits in the third direction.

* * * * *

UNITED STATES PATENT AND TRADEMARK OFFICE
CERTIFICATE OF CORRECTION

| | |
|---|---|
| PATENT NO. | : 11,244,726 B2 |
| APPLICATION NO. | : 17/152355 |
| DATED | : February 8, 2022 |
| INVENTOR(S) | : Hiroshi Maejima |

It is certified that error appears in the above-identified patent and that said Letters Patent is hereby corrected as shown below:

In the Claims

Column 23, Line 22, Claim 1, delete "first".

Column 23, Line 24, Claim 1, delete "first".

Signed and Sealed this
Nineteenth Day of November, 2024

Katherine Kelly Vidal
*Director of the United States Patent and Trademark Office*